(12) United States Patent
Moon et al.

(10) Patent No.: US 11,641,758 B2
(45) Date of Patent: May 2, 2023

(54) DISPLAY DEVICE

(71) Applicant: Samsung Display Co., Ltd., Yongin-Si (KR)

(72) Inventors: Dongjin Moon, Yongin-si (KR); Yeri Jeong, Yongin-si (KR); Inyoung Han, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 50 days.

(21) Appl. No.: 17/213,143

(22) Filed: Mar. 25, 2021

(65) Prior Publication Data

US 2021/0217992 A1 Jul. 15, 2021

Related U.S. Application Data

(63) Continuation of application No. 16/512,310, filed on Jul. 15, 2019, now Pat. No. 10,964,913.

(30) Foreign Application Priority Data

Nov. 30, 2018 (KR) .......................... 10-2018-0153018

(51) Int. Cl.
*H01L 51/52* (2006.01)
*H01L 27/32* (2006.01)

(52) U.S. Cl.
CPC ...... *H01L 51/5253* (2013.01); *H01L 27/3248* (2013.01); *H01L 27/3276* (2013.01); *H01L 51/5221* (2013.01); *H01L 2251/558* (2013.01)

(58) Field of Classification Search
CPC ............... H01L 27/3225; H01L 27/323; H01L 27/3248; H01L 27/3276; H01L 51/5221; H01L 51/5253; H01L 2251/558; H01L 51/5237; H01L 27/3244; H01L 27/3213; H01L 51/50; G06F 2203/04103; G06F 2203/04111; G06F 2203/04112; G06F 3/0412; G06F 3/0443; G06F 3/0446
See application file for complete search history.

(56) References Cited

U.S. PATENT DOCUMENTS

| 9,024,523 | B2 | 5/2015 | Lee et al. |
| 10,205,122 | B2 | 2/2019 | Choi et al. |
| 10,541,380 | B1 | 1/2020 | Sung et al. |

(Continued)

FOREIGN PATENT DOCUMENTS

| EP | 3618120 A1 | 3/2020 |
| KR | 10-2014-0142623 A | 12/2014 |

(Continued)

*Primary Examiner* — Karen Kusumakar
*Assistant Examiner* — Adam S Bowen
(74) *Attorney, Agent, or Firm* — Innovation Counsel LLP

(57) ABSTRACT

A display device may include a hole, a display element, a switching element, a groove, a planarization layer, and a cover layer. The switching element may be electrically connected to the display element. The encapsulation layer may cover the display element. The groove may be located between the hole and the display element. A portion of the planarization layer may be located between a first edge of the planarization layer and a second edge of the planarization layer and may be located in the groove. The first edge of the planarization layer may be located closer to the display element than the second edge of the planarization layer. The cover layer may at least partially cover the first edge of the planarization layer.

21 Claims, 37 Drawing Sheets

(56) References Cited

U.S. PATENT DOCUMENTS

| | | |
|---|---|---|
| 2015/0311260 A1 | 10/2015 | Senda et al. |
| 2017/0237037 A1 | 8/2017 | Choi et al. |
| 2017/0353181 A1 | 12/2017 | Kim et al. |
| 2018/0183015 A1 | 6/2018 | Yun et al. |
| 2019/0181205 A1 | 6/2019 | Kim |
| 2020/0110495 A1 | 4/2020 | Han et al. |
| 2020/0144353 A1 | 5/2020 | Ohara et al. |
| 2020/0168683 A1 | 5/2020 | Son et al. |

FOREIGN PATENT DOCUMENTS

| | | |
|---|---|---|
| KR | 10-2017-0059864 A | 5/2017 |
| KR | 10-2017-0095444 A | 8/2017 |
| KR | 10-2017-0136687 A | 12/2017 |

DISPLAY DEVICE

CROSS-REFERENCE TO RELATED APPLICATION

This application is a continuation application of U.S. patent application Ser. No. 16/512,310 filed Jul. 15, 2019, which claims priority to and the benefit of Korean Patent Application No. 10-2018-0153018, filed on Nov. 30, 2018, in the Korean Intellectual Property Office; the disclosure of the Korean Patent Application is incorporated herein in its entirety by reference.

BACKGROUND

1. Field

The technical field relates to a display device.

2. Description of the Related Art

A display device may include a display area for displaying images.

In a display area of a display device, functions may be added. For example, in addition to displaying images, the display area may receive user inputs.

SUMMARY

Embodiments may be related to a display device including an opening (or hole) that accommodates a functional component in a display area of the display device.

One or more embodiments may be related a display panel including an opening (or hole) for accommodating a functional component.

According to one or more embodiments, a display device includes: a substrate including a first area, a second area, and a third area between the first area and the second area; a plurality of display elements arranged in the second area; a thin-film encapsulation layer covering the plurality of display elements and including an inorganic encapsulation layer and an organic encapsulation layer; a groove provided in the third area; a planarization layer located in the third area and located over the groove; and a cover layer located on the planarization layer and at least partially covering a first end of the planarization layer that is adjacent to the second area.

The cover layer may include a metal layer.

The display device may further include: a first insulating layer arranged under the planarization layer.

The cover layer may include a first portion and a second portion, the first portion extending beyond the first end of the planarization layer, and the second portion overlapping the planarization layer, wherein a width of the second portion may be greater than a width of the first portion.

The first insulating layer may include an inorganic insulating material.

The display device may further include a second insulating layer arranged between the planarization layer and the cover layer.

The second insulating layer and the first insulating layer may contact each other in an area adjacent to an end of the planarization layer.

The second insulating layer may include an inorganic insulating material.

The planarization layer may be located on the organic encapsulation layer and may cover an end of the organic encapsulation layer in the third area.

The display device may further include: lines located in the third area and detouring around the first area, wherein the cover layer may overlap at least one of the lines.

The display device may further include a wire located in the third area and extending along an edge of the first area.

The cover layer may have a ring shape in which at least one side of the cover layer is open when viewed from a direction perpendicular to the substrate, and a portion of the wire may be located in an open area of the cover layer.

According to one or more embodiments, a display device includes: a substrate including a first area, a second area, and a third area between the first area and the second area; a plurality of display elements arranged in the second area; a thin-film encapsulation layer covering the plurality of display elements and including an inorganic encapsulation layer and an organic encapsulation layer; an input sensing layer located on the plurality of display elements; a planarization layer located in the third area; and a metal layer located on the planarization layer and at least partially covering a first end of the planarization layer that is adjacent to the second area.

The input sensing layer may include a conductive layer, and the metal layer may include the same material as that of the conductive layer.

The display device may further include: a first insulating layer located under the planarization layer.

The metal layer may include a first portion and a second portion, the first portion extending beyond the first end of the planarization layer, and the second portion overlapping the planarization layer, wherein a width of the second portion may be greater than a width of the first portion.

The display device may further include: a second insulating layer located between the planarization layer and the metal layer.

The second insulating layer may be one body with an insulating layer included in the input sensing layer.

The display device may further include: a wire located in the third area and located between the first area and the metal layer.

A signal for detecting whether a crack occurs around the first area may be applied to the wire.

The metal layer may have a ring shape in which at least a portion of the metal layer is open when viewed from a direction perpendicular to the substrate.

The display device may further include: lines located in the third area and detouring around the first area, wherein the metal layer may overlap at least one of the lines.

The lines may include a data line or a scan line.

The display device may further include: a shield layer located in the third area and overlapping some of the lines.

An embodiment may be related to a display device. The display device may include a hole, a display element, a switching element, a groove, a planarization layer, and a cover layer. The switching element may be electrically connected to the display element. The encapsulation layer may cover the display element. The groove may be located between the hole and the display element. A portion of the planarization layer may be located between a first edge of the planarization layer and a second edge of the planarization and may be located in the groove. The first edge of the planarization layer may be located closer to the display element than the second edge of the planarization layer. The cover layer may at least partially cover the first edge of the planarization layer.

The cover layer may include a metal layer.

The display device may include a first insulating layer arranged between the encapsulation layer and the first edge of the planarization layer.

The cover layer may include a first portion and a second portion. The first edge of the planarization layer may be located between the first portion and the second portion. The second portion may overlap the planarization layer and may be wider than the first portion.

The first insulating layer may include an inorganic insulating material.

The display device may include a second insulating layer arranged between the planarization layer and the cover layer.

The second insulating layer and the first insulating layer may directly contact each other at the first edge of the planarization layer.

The second insulating layer may include an inorganic insulating material.

The encapsulation layer may include an organic encapsulation layer. The planarization layer may partially overlap the organic encapsulation layer. An edge of the organic encapsulation layer may be located between the groove and the first edge of the planarization layer.

The display device may include a conductive line electrically connected to the transistor and overlapping the cover layer. The hole may be located between two sections of the conductive line. The conductive line may not intersect a perimeter of the hole in a plan view of the display device.

The display device may include a conductive wire substantially extending along and substantially surrounding a perimeter of the hole in a plan view of the display device.

Two portions of the cover layer may be spaced from each other and opposite each other in the plan view of the display device. A portion of the conductive wire may be located between the two portions of the cover layer.

An embodiment may be related to a display device. The display device may include the following elements: a hole; a display element; a switching element electrically connected to the display element; an input sensing element; an encapsulation layer covering the display element and located between the display element and the input sensing element; a planarization layer located between the hole and the input sensing element, wherein first edge of the planarization layer may be located closer to the input sensing element than a second edge of the planarization layer; and a metal layer at least partially covering the first edge of the planarization layer.

The input sensing element may include a conductive layer. A conductive material of the metal layer may be identical to a conductive material of the conductive layer.

The display device may include a first insulating layer located between the encapsulation layer and the first edge of the planarization layer.

The metal layer may include a first portion and a second portion. The first edge of the planarization layer may be located between the first portion and the second portion. The second portion may overlap the planarization layer and may be wider than the first portion.

The display device may include a second insulating layer located between the planarization layer and the metal layer.

The second insulating layer may directly contact each of the metal layer and a conductive member of the input sensing element.

The display device may include a conductive wire. A portion of the conductive wire may be located between the hole and the metal layer.

The wire may substantially surround a perimeter of the hole in a plan view of the display device and may receive a signal for detecting whether a crack occurs around the hole.

Two portions of the metal layer may be spaced from each other and opposite each other in a plan view of the display device. At least one section of the conductive wire may be located between the two portions of the metal layer.

The display device may include a conductive line electrically connected to at least one of the transistor and the input sensing element and overlapping the metal layer. The hole may be located between two sections of the conductive line. The conductive line may not intersect a perimeter of the hole in a plan view of the display device The conductive line may be electrically connected to a gate electrode of the switching element or a source electrode of the switching element.

The display device may include a shield layer located between the metal layer and the input sensing element and overlapping the conductive line.

DETAILED DESCRIPTION

Figure 1:
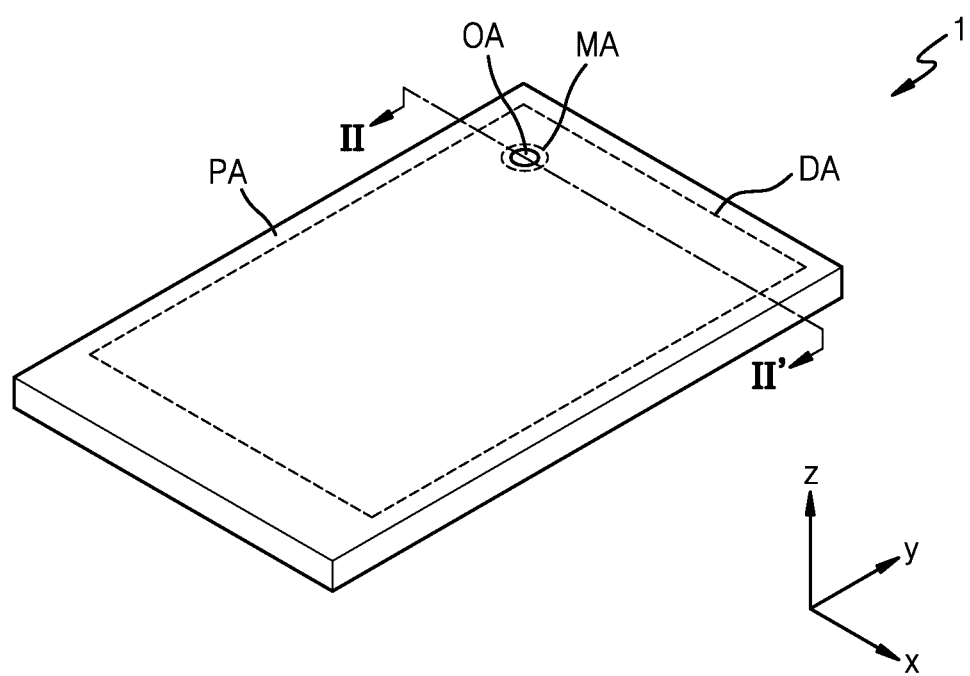
FIG. 1 is a perspective view of a display device according to an embodiment.

Example embodiments are described with reference to the drawings. Practical embodiments may be embodied in many different forms and should not be construed as limited to the described example embodiments.

In the drawings, like reference numerals may denote like elements or corresponding elements, and related description may not be repeated.

The term "and/or" includes any and all combinations of one or more of the associated items.

Although the terms "first," "second," etc. may be used to describe various components, these components should not be limited by these terms. These terms are used to distinguish one component from another. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

The singular forms "a", "an" and "the" may include the plural forms as well, unless the context clearly indicates otherwise.

The terms "comprises/includes" and/or "comprising/including" may specify the presence of stated features or components, but do not preclude the presence or addition of one or more other features or components.

When a first element is referred to as being "on" or "connected to" a second element, the first element can be directly or indirectly on or connected to the second element, and one or more intervening elements may be present between the first element and the second element.

When a certain embodiment is implemented differently, a specific process order may be performed differently from the described order. For example, two consecutively described processes may be performed substantially at the same time or performed in an order opposite to the described order.

The term "conductive" may mean "electrically conductive." The term "trace line" may mean "conductive line." The term "connect" may mean "electrically connect." The term "insulate" may mean "electrically insulate." The term "opening" may mean "hole." The term "opening area" may mean "opening." The term "end" may mean "edge." The term "the same as" may mean "equal to." The term "different" may mean "unequal." The term "contact" may mean "directly contact." The expression "A to B" may mean "in a range of A to B."

FIG. 1 is a perspective view of a display device 1 according to an embodiment.

Referring to FIG. 1, the display device 1 includes a first area OA and a display area DA, which is a second area at least partially surrounding the first area OA. The display device 1 may provide an image using light emitted from a plurality of pixels arranged in the display area DA. In an embodiment, it is shown in FIG. 1 that one first area OA is arranged inside the display area DA. In another embodiment, the number of first areas OA may be two or more. The first area OA may be entirely surrounded by the display area DA. The first area OA may be an area or hole in which a component is arranged.

An intermediate area MA may be arranged as a third area between the first area OA and the display area DA. The display area DA may be surrounded by an outer area PA, which is a fourth area. The intermediate area MA and the outer area PA may be non-display areas in which no pixels are arranged. The intermediate area MA may be entirely surrounded by the display area DA, and the display area DA may be entirely surrounded by the outer area PA.

An organic light-emitting display device is described as the display device 1 according to an embodiment. Alternatively, the display device 1 may be a liquid crystal display, an inorganic light-emitting display, or a quantum dot light-emitting display.

FIG. 1 illustrates that the first area OA is substantially circular. In a plan view (or when viewed from a direction perpendicular to a main surface of a substrate), a first area OA may have one or more of other shapes, such as one or more of a circular shape, an elliptical shape, a polygonal shape, a star shape, and a diamond shape.

Though it is shown in FIG. 1 that one first area OA is provided and is substantially circular. The number of first areas OA may be two or more, and a shape of each of the first areas OA be a circular shape, an elliptical shape, a polygonal shape such as a triangular shape and a quadrangular shape, a star shape, a diamond shape, or an irregular shape and may be variously modified.

Figure 2:
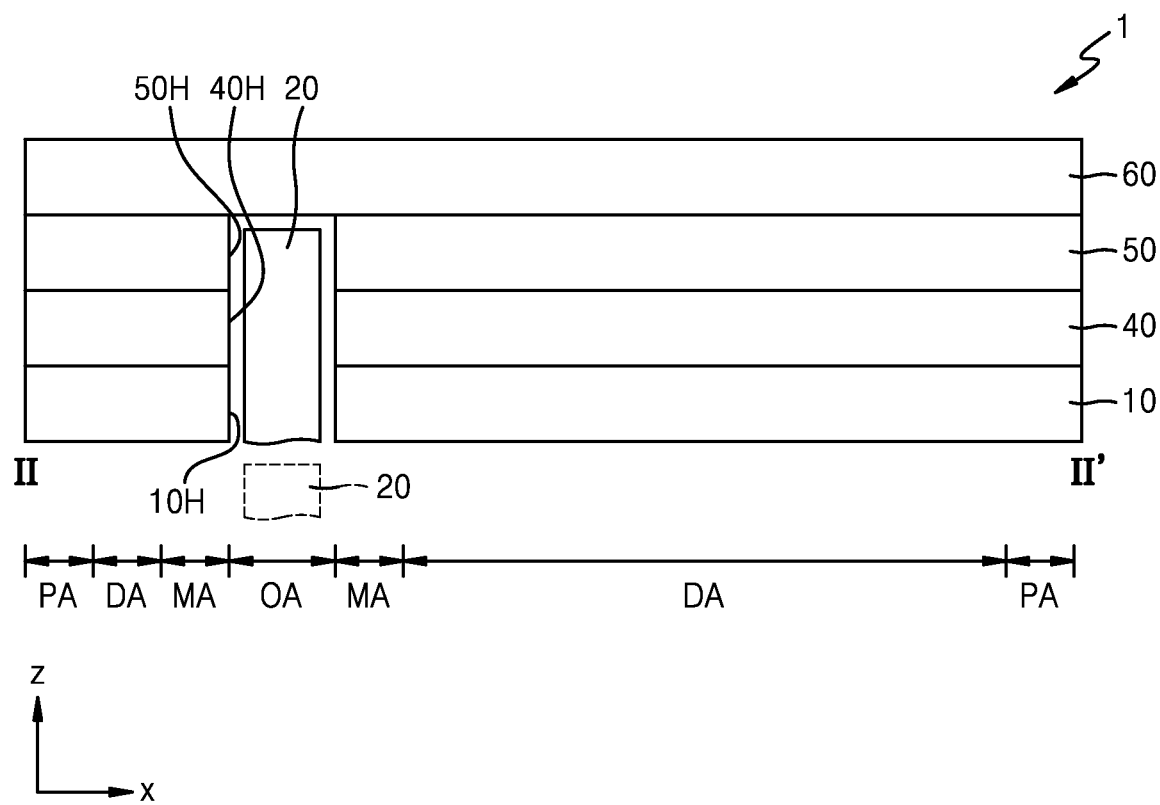
FIG. 2 is a cross-sectional view of a display device according to an embodiment.

FIG. 2 is a cross-sectional view of the display device 1 according to an embodiment, taken along line II-II' of FIG. 1.

Referring to FIG. 2, the display device 1 may include a display panel 10; the display device may further include an input sensing layer 40 and an optical functional layer 50 arranged on the display panel 10. These layers may be covered by a window 60. The display device 1 may include, may be, or may be included in one of various electronic devices such as a mobile phone, a notebook computer, and or a smartwatch.

The display panel 10 may display an image. The display panel 10 includes pixels arranged in the display area DA. Each of the pixels may include a display element and a pixel circuit connected to the display element. The display element may include an organic light-emitting diode, an inorganic light-emitting diode, or a quantum dot light-emitting diode.

The input sensing layer 40 obtains coordinate information corresponding to an external input, for example, a touch event. The input sensing layer 40 may include a sensing electrode (or a touch electrode) and trace lines connected to the sensing electrode. The input sensing layer 40 may be arranged on the display panel 10. The input sensing layer 40 may sense an external input using a mutual cap method and/or a self-cap method.

The input sensing layer 40 may be directly formed on the display panel 10 or may be formed separately and then coupled to the display panel 10 by using an adhesive layer such as an optical clear adhesive (OCA). For example, the input sensing layer 40 may be successively formed after a process of forming the display panel 10. In an embodiment, the adhesive layer may not be arranged between the input sensing layer 40 and the display panel 10. Though FIG. 2 shows that the input sensing layer 40 is arranged between the display panel 10 and the optical functional layer 50, the input sensing layer 40 may be arranged on the optical functional layer 50 in an embodiment.

The optical functional layer 50 may include a reflection prevention layer. The reflection prevention layer may reduce reflectivity of light (external light) incident from the outside toward the display panel 10 through the window 60. The reflection prevention layer may include a retarder and a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film. The retarder and the polarizer themselves or their protective films may be defined as a base layer of the reflection prevention layer.

In an embodiment, the reflection prevention layer may include a black matrix and color filters. The color filters may be arranged by taking into account colors of light emitted respectively from pixels of the display panel 10. In an embodiment, the reflection prevention layer may include a destructive interference structure. The destructive interference structure may include a first reflection layer and a second reflection layer respectively arranged in different layers. First reflected light and second reflected light respectively reflected by the first reflection layer and the second reflection layer may create destructive-interference and thus the reflectivity of external light may be reduced.

The optical functional layer 50 may include a lens layer. The lens layer may improve the emission efficiency of light emitted from the display panel 10 or reduce the color deviation of light. The lens layer may include a layer having a concave or convex lens shape and/or include a plurality of layers respectively having different refractive indexes. The optical functional layer 50 may include both the reflection prevention layer and the lens layer or include one of the reflection prevention layer and the lens layer.

The display panel 10, the input sensing layer 40, and/or the optical functional layer 50 may include an opening. With regard to this, FIG. 2 shows that the display panel 10, the input sensing layer 40, and the optical functional layer 50 respectively include first to third openings 10H, 40H, and 50H and that the first to third openings 10H, 40H, and 50H overlap each other. The first to third openings 10H, 40H, and 50H are located to correspond to the first area OA, and the first area OA may be an opening. Sizes (or diameters) of the first to third openings 10H, 40H, and 50H may be the same or different from each other. In an embodiment, at least one of the display panel 10, the input sensing layer 40, and the optical functional layer 50 may not include an opening. For example, one or two of the display panel 10, the input sensing layer 40, and the optical functional layer 50 may not include an opening.

The first area OA may be a component area (e.g. a sensor area, a camera area, a speaker area, etc.) in which a component 20 for adding various functions to the display device 1 is located. As shown by a solid line in FIG. 2, the component 20 may be located in the first to third openings 10H, 40H, and 50H. In an embodiment, at least one of the display panel 10, the input sensing layer 40, or the optical functional layer 50 may not include an opening.

The component 20 may include/be an electronic element. For example, the component 20 may include an electronic element that uses light or sound. For example, an electronic element may be a sensor such as an infrared sensor that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in at least one of various wavelength bands such as visible light, infrared light, and ultraviolet light. In an embodiment, the first area OA may be a transmission area through which light and/or sound are output or received by the component 20.

In an embodiment, in the case where the display device 1 is used as a smartwatch or an instrument panel for an automobile, the component 20 may be a member including a needle of a clock or a needle, etc. indicating predetermined information (e.g. the velocity of a vehicle, etc.). In the case where the display device 1 includes the component 20 such as a needle of a clock or an instrument panel for an automobile, the component 20 may be exposed to the outside through the window 60, which may include an opening corresponding to the first area OA. In the case where the display device 1 includes the component 20 such as a speaker, the window 60 may include an opening corresponding to the first area OA.

The component 20 may include element(s) related to a function of the display panel 10 or an element such as an accessory that increases an esthetic sense of the display panel 10. Though not shown in FIG. 2, a layer including an OCA, etc. may be located between the window 60 and the optical functional layer 50.

Figure 3:
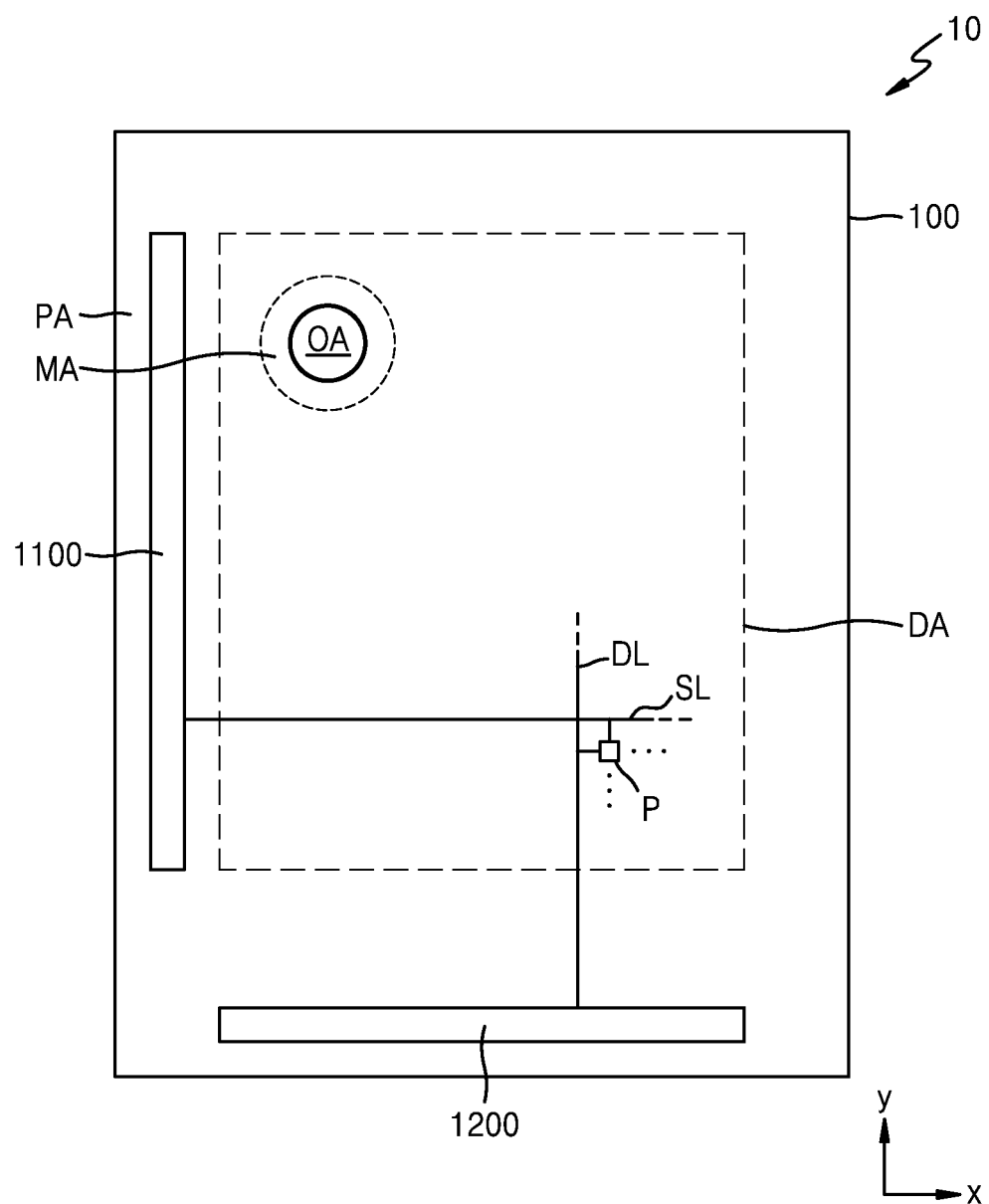
FIG. 3 is a plan view of a display panel according to an embodiment.
Figure 4:
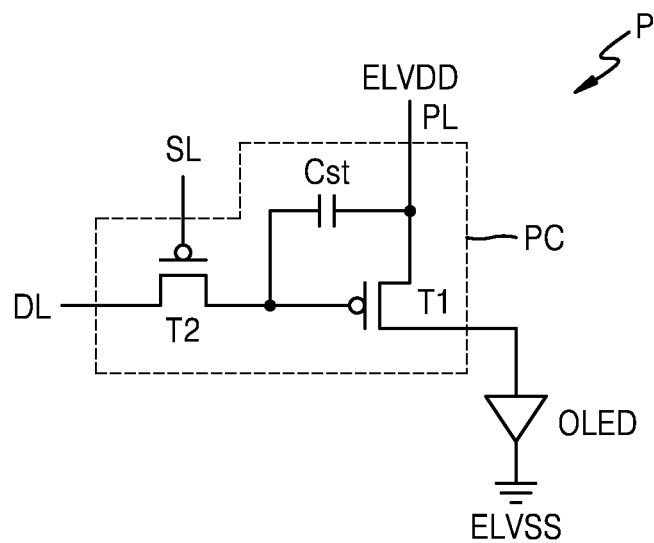
FIG. 4 is an equivalent circuit diagram of one of the pixels of a display panel according to an embodiment.

FIG. 3 is a plan view of the display panel 10 according to an embodiment, and FIG. 4 is an equivalent circuit diagram of one of the pixels of the display panel 10.

Referring to FIG. 3, the display panel 10 includes the first area OA, the display area DA, which is the second area, the intermediate area MA, which is the third area, and the outer area PA. FIG. 3 may be a figure of a substrate 100 of the display panel 10. For example, it may be understood that the substrate 100 includes the first area OA, the display area DA, the intermediate area MA, and the outer area PA.

The display panel 10 includes a plurality of pixels P arranged in the display area DA. As shown in FIG. 4, each pixel P includes a pixel circuit PC and an organic light-emitting diode OLED as a display element connected to the pixel circuit PC. The pixel circuit PC may include a first thin film transistor T1, a second thin film transistor T2, and a storage capacitor Cst. Each pixel P may emit, for example, red, green, or blue light, or red, green, blue, or white light through the organic light-emitting diode OLED.

The second thin film transistor T2 is a switching thin film transistor and is connected to a scan line SL and a data line DL, and may transfer a data voltage input from the data line DL to the first thin film transistor T1 in response to a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied from the driving voltage line PL.

The first thin film transistor T1 is a driving thin film transistor and may be connected to the driving voltage line PL and the storage capacitor Cst and may control a driving current flowing through the organic light-emitting diode OLED from the driving voltage line PL in response to the voltage value stored in the storage capacitor Cst. The organic light-emitting diode OLED may emit light having predetermined brightness by using the driving current. An opposite electrode (e.g. a cathode) of the organic light-emitting diode OLED may receive a second power voltage ELVSS.

Though it is shown in FIG. 4 that the pixel circuit PC includes two thin film transistors and one storage capacitor. The number of thin film transistors and the number of storage capacitors may be variously modified depending on a design of the pixel circuit PC.

Referring to FIG. 3 again, the intermediate area MA may surround the first area OA. The intermediate area MA is an area in which a display element such as the organic light-emitting diode OLED is not arranged. Trace lines configured to provide a signal to pixels P arranged around the first area OA may pass across the intermediate area MA. A scan driver 1100 configured to provide a scan signal to each pixel P, a data driver 1200 configured to provide a data signal to each pixel P, main power wires (not shown) configured to provide first and second power voltages, etc. may be arranged in the outer area PA. Though it is shown in FIG. 3 that the data driver 1200 is adjacent to one side of the substrate 100, the data driver 1200 may be arranged on a flexible printed circuit board (FPCB) electrically connected to a pad arranged on one side of the display panel 10 according to an embodiment.

Figure 5:
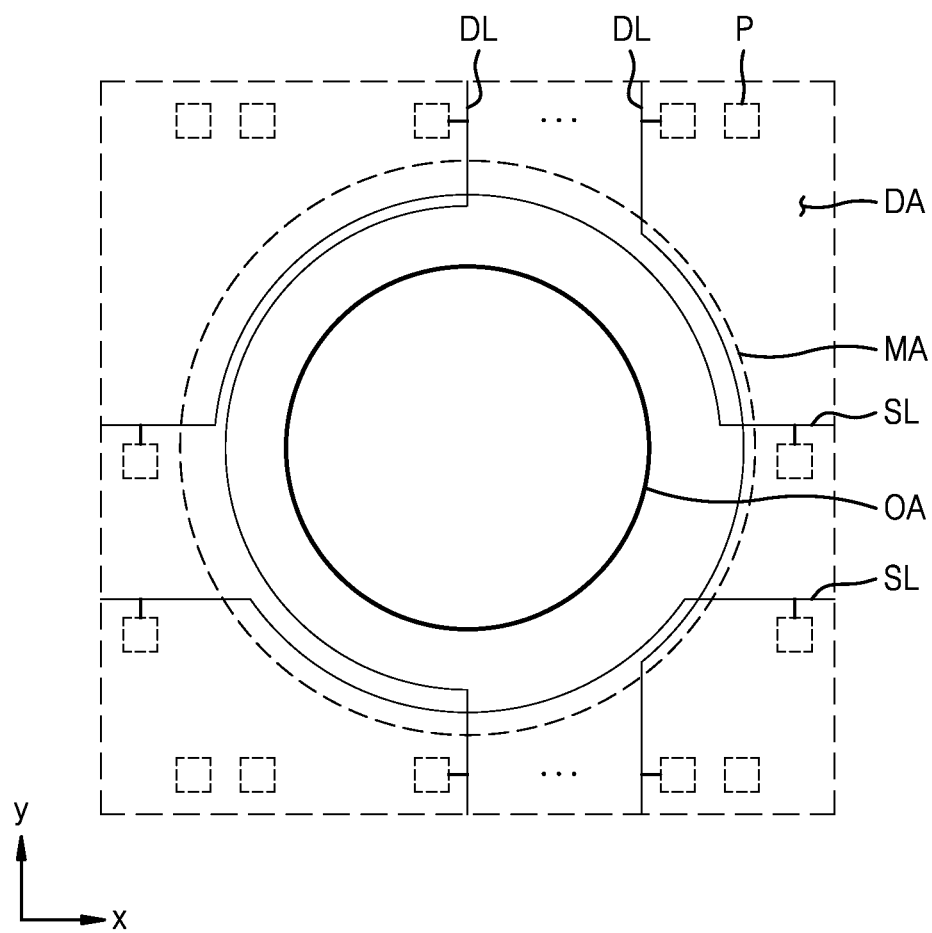
FIG. 5 is a plan view of a portion of a display panel according to an embodiment and shows trace lines located in a first non-display area.

FIG. 5 is a plan view of a portion of the display panel 10 according to an embodiment and shows trace lines located in a first non-display area.

Referring to FIG. 5, pixels P may be arranged in the display area DA, and the intermediate area MA may be arranged between the first area OA and the display area DA. Pixels P adjacent to the first area OA may be spaced from each other around the first area OA. The pixels P may be spaced up and down around the first area OA, or spaced left and right around the first area OA.

Trace lines adjacent to the first area OA among the trace lines configured to supply a signal to the pixels P may detour (or bypass) around the first area OA. Some of the data lines DL that cross the display area DA may extend in a y-direction so as to provide data signals to the pixels P arranged at opposite sides of the first area OA, and detour along an edge of the first area OA in the intermediate area MA. Some of the scan lines SL that cross the display area DA may extend in an x-direction so as to provide scan signals to the pixels P arranged at opposite sides of the first area OA, and detour along an edge of the first area OA in the intermediate area MA.

Figure 6:
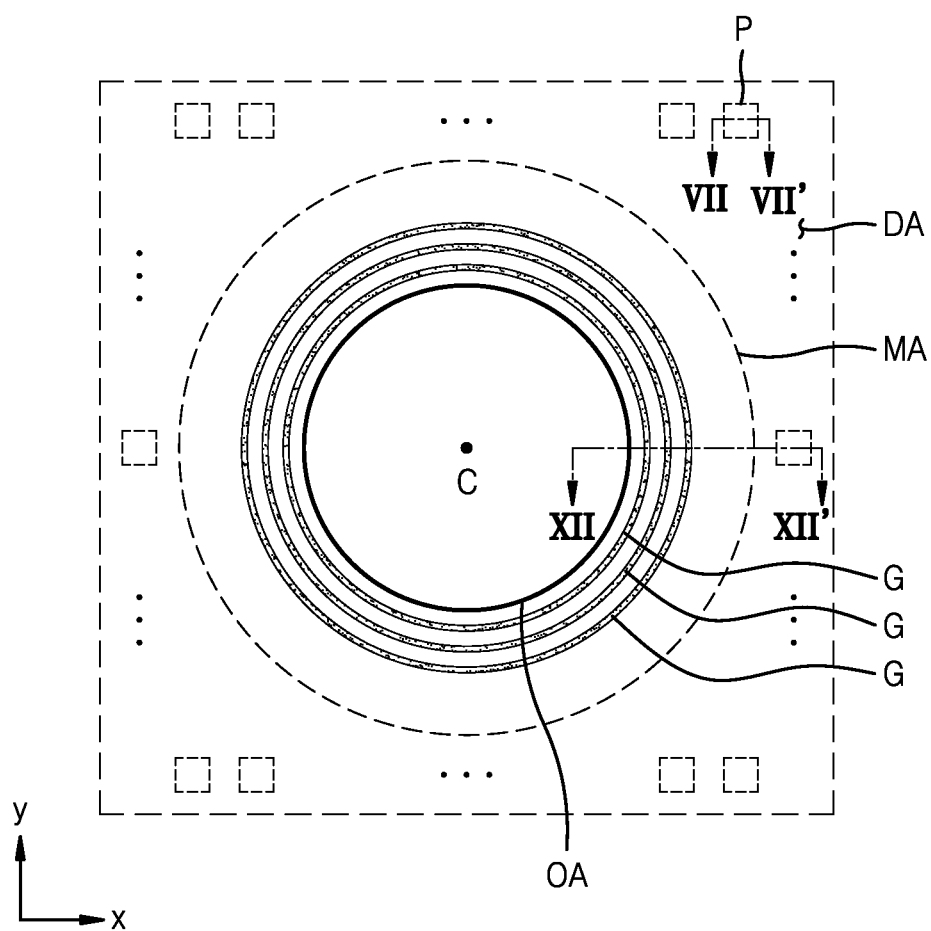
FIG. 6 is a plan view of a portion of a display panel according to an embodiment and shows a groove located in a first non-display area.

FIG. 6 is a plan view of a portion of the display panel 10 according to an embodiment and shows a groove located in the first non-display area.

Referring to FIG. 6, one or more grooves are located between the first area OA and the display area DA. Though it is shown in FIG. 6 that three grooves are located between the first area OA and the display area DA, one, two, or four or more grooves may be arranged in the intermediate area MA according to an embodiment.

In a plan view, the grooves G may have a ring shape entirely surrounding the first area OA and may be located in the intermediate area MA. In a plan view, a radius of each of the grooves G from a center C of the first area OA may be greater than a radius of the first area OA. The grooves G may be spaced from each other.

Referring to FIGS. 5 and 6, the grooves G may be closer to the first area OA than detour portions of the data lines DL and/or the scan lines SL that detour around an edge of the first area OA.

Figure 7:
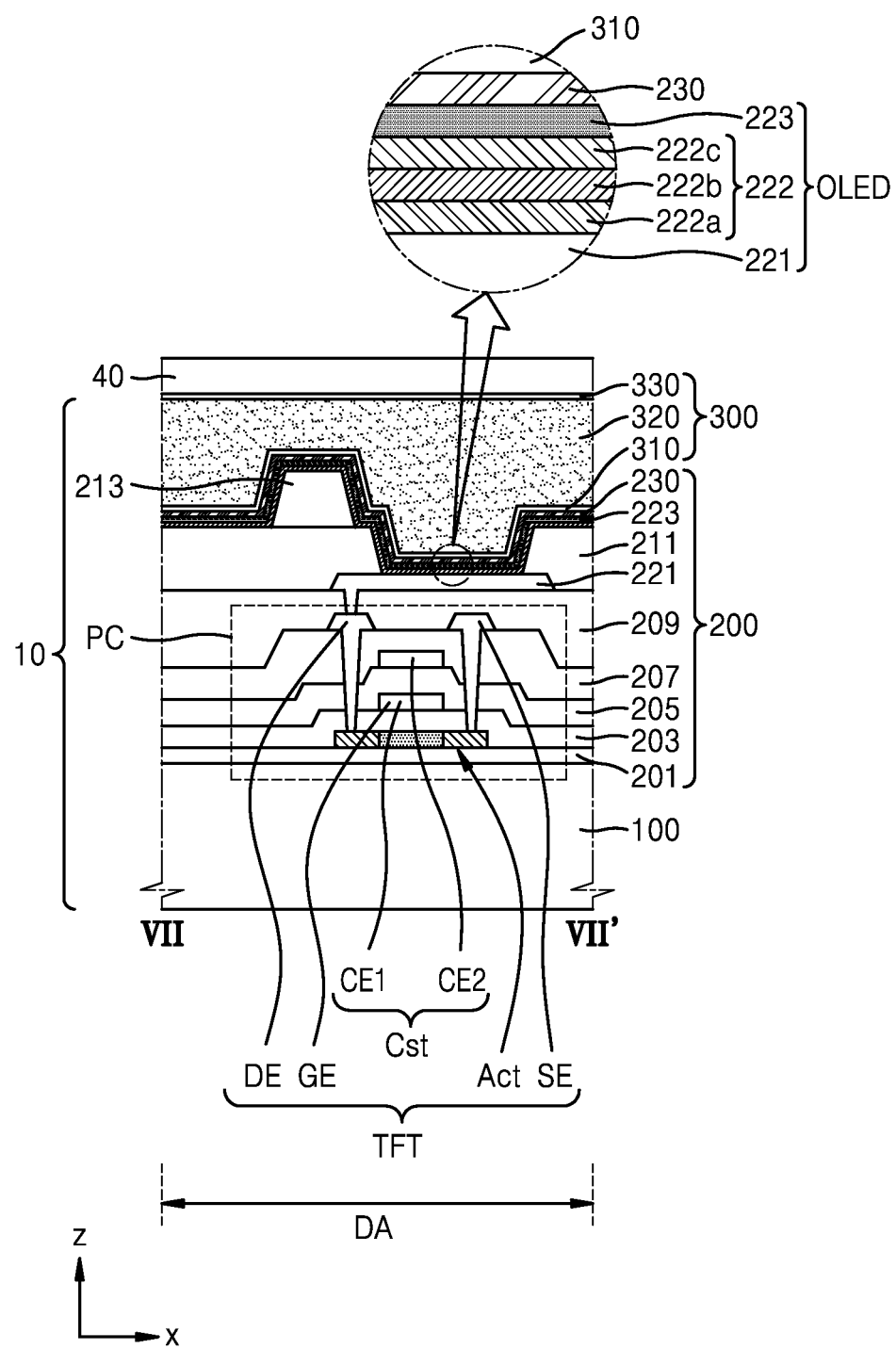
FIG. 7 is a cross-sectional view of a display panel according to an embodiment.

FIG. 7 is a cross-sectional view of the display panel 10 according to an embodiment and corresponds to a cross-section taken along line VII-VII' of FIG. 6.

Referring to FIG. 7, a display layer 200 (or pixel array layer or display unit 200) may include a pixel circuit PC and an organic light-emitting diode OLED electrically connected to the pixel circuit PC. The display unit 200 may be arranged in the display area DA. The pixel circuit PC may be arranged on the substrate 100, and the organic light-emitting diode OLED may be located on the pixel circuit PC. The pixel circuit PC includes a thin film transistor TFT and a storage capacitor Cst located over the substrate 100. A pixel electrode 221 is electrically connected to the thin film transistor TFT and the storage capacitor Cst.

The substrate 100 may include a polymer resin or glass. In an embodiment, the substrate 100 may include a polymer resin such as one of polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and cellulose acetate propionate (CAP). The substrate 100 may be flexible. The substrate 100 may include a glass material containing $SiO_2$ as a main component or may include a resin such as a reinforced plastic, and may be rigid. The substrate 100 may have a stacked structure including a layer including the above-described polymer resin and a barrier layer located on the above-described polymer resin layer. For example, the substrate 100 may have a stacked structure including a first polymer resin layer, a first barrier layer, a second polymer resin layer, and a second barrier layer. The substrate 100 including a polymer resin may improve flexibility. The barrier layer may include silicon nitride (SiNx), silicon oxynitride (SiON), or/and silicon oxide (SiOx).

A buffer layer 201 configured to prevent impurities from penetrating into a semiconductor layer Act of the thin film transistor TFT may be provided on the substrate 100. The buffer layer 201 may include an inorganic insulating material such as silicon nitride (SiNx, x>0), silicon oxynitride (SiON), and silicon oxide (SiOx, x>0) and may include a single layer or a multi-layer structure including the above-described inorganic insulating materials.

The pixel circuit PC may be arranged on the buffer layer 201. The pixel circuit PC includes the thin film transistor TFT and the storage capacitor Cst. The thin film transistor TFT may include the semiconductor layer Act, a gate electrode GE, a source electrode SE, and a drain electrode DE. The thin film transistor TFT shown in FIG. 7 may be the driving thin film transistor described with reference to FIG. 4. FIG. 7 shows a top-gate type thin film transistor TFT. The thin film transistor TFT may be a bottom-gate type thin film transistor according to an embodiment.

The semiconductor layer Act may include polycrystalline silicon. Alternatively, the semiconductor layer Act may include amorphous silicon, an oxide semiconductor, or an organic semiconductor. The gate electrode GE may include a low resistance metal material. The gate electrode GE may include a conductive material Mo, Al, Cu, and/or Ti. The gate electrode GE may include a single layer or a multi-layer structure including the above materials.

The gate insulating layer 203 between the semiconductor layer Act and the gate electrode GE may include an inorganic insulating material such as silicon oxide, silicon nitride, and silicon oxynitride, aluminum oxide, titanium oxide, tantalum oxide, and/or hafnium oxide. The gate insulating layer 203 may include a single layer or a multi-layer structure including the above materials.

The source electrode SE and the drain electrode DE may include a material having excellent conductivity. The source electrode SE and the drain electrode DE may include a conductive material including Mo, Al, Cu, and/or Ti. The source electrode SE and the drain electrode DE may include a single layer or a multi-layer structure including the above materials. In an embodiment, the source electrode SE and the drain electrode DE may include a multi-layer structure of Ti/Al/Ti.

The storage capacitor Cst includes a lower electrode CE1 and an upper electrode CE2 that overlap each other with an intervening first interlayer insulating layer 205. The storage capacitor Cst may overlap the thin film transistor TFT. With regard to this, it is shown in FIG. 7 that the gate electrode GE of the thin film transistor TFT serves as the lower electrode CE1 of the storage capacitor Cst. In an embodiment, the storage capacitor Cst may not overlap the thin film transistor TFT. The storage capacitor Cst may be covered by a second interlayer insulating layer 207.

The first and second interlayer insulating layers 205 and 207 may include an inorganic insulating material such as silicon oxide, silicon nitride, and silicon oxynitride, aluminum oxide, titanium oxide, tantalum oxide, and/or hafnium oxide. The first and second interlayer insulating layers 205 and 207 may include a single layer or a multi-layer structure including the above materials.

The pixel circuit PC including the thin film transistor TFT and the storage capacitor Cst may be covered by a planarization insulating layer 209. The planarization insulating layer 209 may include a substantially flat top surface. The planarization insulating layer 209 may include an organic insulating material including a general-purpose polymer such as polymethylmethacrylate (PMMA) and polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend. In an embodiment, the planarization insulating layer 209 may include polyimide. Alternatively, the planarization insulating layer 209 may include an inorganic insulating material or inorganic and organic insulating materials.

The pixel electrode 221 may be formed on the planarization insulating layer 209. The pixel electrode 221 may include a conductive oxide such as indium tin oxide (ITO), zinc oxide (IZO), zinc oxide (ZnO), indium oxide ($In_2O_3$), indium gallium oxide (IGO), or aluminum zinc oxide (AZO). In an embodiment, the pixel electrode 221 may include a reflective layer including Ag, Mg, Al, Pt, Pd, Au, Ni, Nd, Ir, Cr, and/or a compound. In an embodiment, the pixel electrode 221 may further include a layer including ITO, IZO, ZnO, or $In_2O_3$ over and/or under the reflective layer.

A pixel-defining layer 211 may be formed on the pixel electrode 221. The pixel-defining layer 211 may include an opening that exposes a top surface of the pixel electrode 221 and cover edges of the pixel electrode 221. Alternatively, the pixel-defining layer 211 may include an inorganic insulating material such as silicon nitride (SiNx), silicon oxynitride (SiON), and silicon oxide (SiOx). Alternatively, the pixel-defining layer 211 may include an organic insulating material and an inorganic insulating material.

The intermediate layer 222 includes an emission layer 222b. The intermediate layer 222 may include a first functional layer 222a arranged under the emission layer 222b and/or a second functional layer 222c arranged on the emission layer 222b. The emission layer 222b may include a low molecular weight or polymer organic material that emits light of a predetermined color.

The first functional layer 222a may include an organic layer. The first functional layer 222a may include a single layer or a multi-layer structure. For example, in the case where the first functional layer 222a includes a polymer material, the first functional layer 222a includes a hole transport layer (HTL), which has a single-layered structure, and may include poly-(3,4)-ethylene-dihydroxy thiophene (PEDOT) or polyaniline (PANI). In the case where the first functional layer 222a includes a low molecular weight material, the first functional layer 222a may include a hole injection layer (HIL) and an HTL.

The second functional layer 222c may be omitted. For example, in the case where the first functional layer 222a and the emission layer 222b include a polymer material, it is preferable that the second functional layer 222c is provided. The second functional layer 222c may be a single layer or a multi-layer structure. The second functional layer 222c may include an electron transport layer (ETL) and/or an electron injection layer (EIL).

The emission layer 222b of the intermediate layer 222 may be arranged in all pixels in the display area DA. The emission layer 222b may overlap a portion of the pixel electrode 221 that is exposed through the opening of the pixel-defining layer 211. Unlike the emission layer 222b, there may be the first and second functional layers 222a and 222c of the intermediate layer 222 in not only the display area DA of FIG. 7 but also a first non-display area NDA1 (see FIG. 12).

The opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, and/or an alloy. Alternatively, the opposite electrode 223 may further include a layer including ITO, IZO, ZnO, or $In_2O_3$ on the (semi) transparent layer including the above-mentioned material. The opposite electrode 223 may be provided in not only the display area DA but also the intermediate area MA. The intermediate layer 222 and the opposite electrode 223 may be formed by a thermal deposition method.

A capping layer 230 may be arranged on the opposite electrode 223. For example, the capping layer 230 may include LiF and may be formed by a thermal deposition method. Alternatively, the capping layer 230 may include an inorganic insulating material such as silicon oxide, silicon nitride, and/or silicon oxynitride. Alternatively, the capping layer 230 may be omitted.

A spacer 213 may be provided on the pixel-defining layer 211. The spacer 213 may include an organic insulating material such as polyimide. Alternatively, the spacer 213 may include an inorganic insulating material such as silicon nitride or silicon oxide, or include an organic insulating material and an inorganic insulating material.

The spacer 213 may include a material different from that of the pixel-defining layer 211. Alternatively, the spacer 213 may include the same material as that of the pixel-defining layer 211. In an embodiment, the pixel-defining layer 211 and the spacer 213 may be simultaneously formed during a mask process that uses a half-tone mask, etc. In an embodiment, the pixel-defining layer 211 and the spacer 213 may include polyimide.

The organic light-emitting diode OLED is covered by a thin-film encapsulation layer 300. The thin-film encapsulation layer 300 may include at least one organic encapsulation layer and at least one inorganic encapsulation layer. In an embodiment, it is shown in FIG. 7 that the thin-film encapsulation layer 300 includes first and second inorganic encapsulation layers 310 and 330, and an organic encapsulation layer 320 between the layers 310 and 330. In an embodiment, the number of organic encapsulation layers, the number of inorganic encapsulation layers, and a stacking sequence may be modified.

The first and second inorganic encapsulation layers 310 and 330 may include one or more inorganic insulating materials such as aluminum oxide, titanium oxide, tantalum oxide, hafnium oxide, zinc oxide, silicon oxide, silicon nitride, or silicon oxynitride. The inorganic insulating materials may be formed by chemical vapor deposition (CVD). The organic encapsulation layer 320 may include a polymer-based material. The polymer-based material may include an acrylic-based resin, an epoxy-based resin, polyimide, and polyethylene.

The input sensing layer 40 may be arranged on the display panel 10. It is shown in FIG. 10 that the input sensing layer 40 is directly formed on the display panel 10 and contacts the thin-film encapsulation layer 300.

Figure 8:
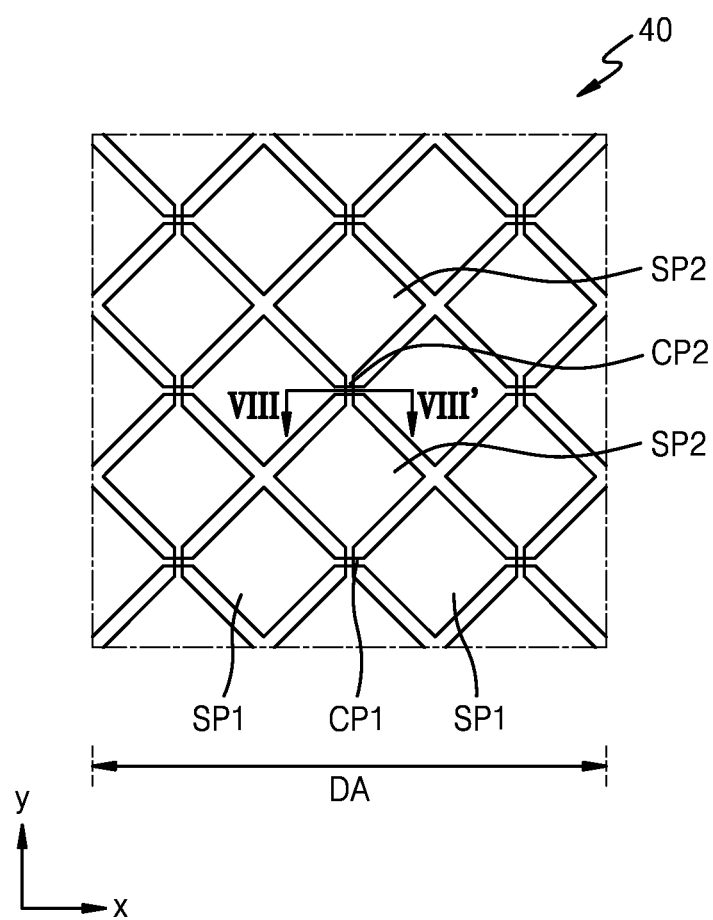
FIG. 8 is a plan view of an input sensing layer according to an embodiment.

FIG. 8 is a plan view of the input sensing layer 40 according to an embodiment. FIG. 8 shows a portion of the input sensing layer 40 that corresponds to the display area DA as shown in FIG. 7.

Referring to FIG. 8, the input sensing layer 40 includes a first sensing electrode SP1 and a second sensing electrode SP2 located in the display area DA. First sensing electrodes SP1 are arranged in an x-direction, and second sensing electrodes SP2 are arranged in a y-direction that intersects with the first sensing electrodes SP1. The first sensing electrodes SP1 and the second sensing electrodes SP2 may perpendicularly intersect with each other.

The first sensing electrodes SP1 and the second sensing electrodes SP2 may be arranged such that corners of the electrodes are adjacent to each other. Adjacent first sensing electrodes SP1 may be electrically connected to each other through a first connection electrode CP1, and adjacent second sensing electrodes SP2 may be electrically connected to each other through a second connection electrode CP2.

Figure 9A:
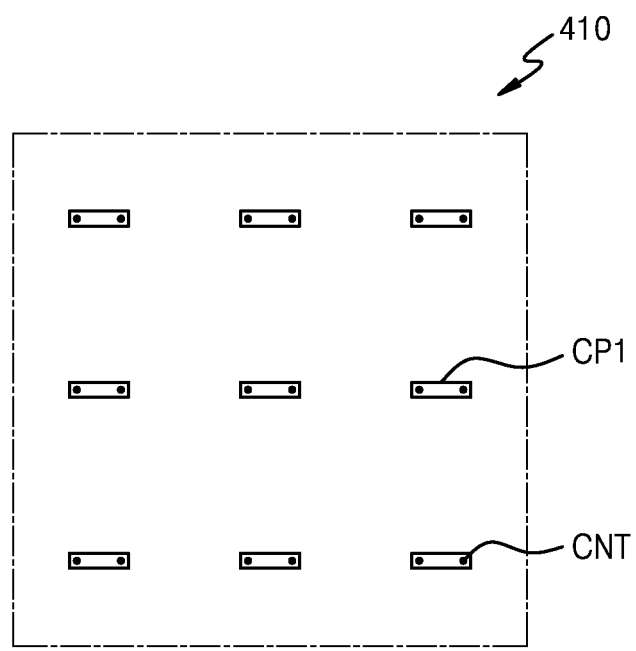
FIG. 9A is a plan views of a first conductive layer of an input sensing layer according to an embodiment.
Figure 9B:
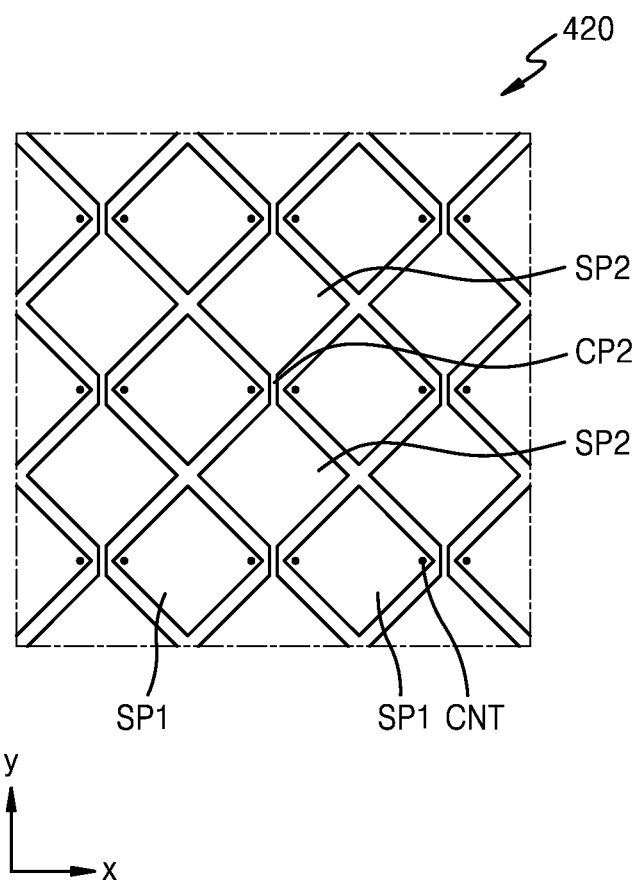
FIG. 9B is a plan view of a second conductive layer of an input sensing layer according to an embodiment.
Figure 9C:
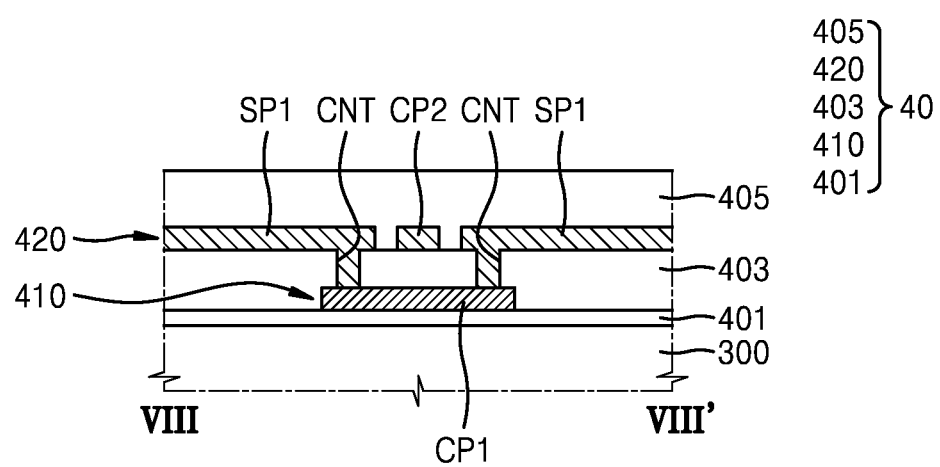
FIG. 9C is a cross-sectional view of an input sensing layer according to an embodiment.

FIGS. 9A and 9B are plan views of a first conductive layer 410 and a second conductive layer 420 of the input sensing layer 40 according to an embodiment, and FIG. 9C is a cross-sectional view of the input sensing layer 40 according to an embodiment and may correspond to a cross-section taken along line VIII-VIII' of FIG. 8.

Referring to FIGS. 9A and 9B, the first sensing electrode SP1 and the second sensing electrode SP2 may be arranged on the same layer. The first conductive layer 410 may include the first connection electrode CP1 (see FIG. 9A), and the second conductive layer 420 may include the first sensing electrode SP1, the second sensing electrode SP2, and the second connection electrode CP2 (see FIG. 9B).

The second sensing electrodes SP2 may be connected to each other by the second connection electrode CP2 arranged on the same layer. The first sensing electrodes SP1 may be arranged in the x-direction and may be connected to each other by the first connection electrode CP1 arranged on a different layer.

Referring to FIG. 9C, an intermediate insulating layer 403 may be arranged between the first conductive layer 410 and the second conductive layer 420. The first sensing electrodes SP1 arranged in the second conductive layer 420 may be connected to the first connection electrode CP1 arranged in the first conductive layer 410 through a contact hole CNT of the intermediate insulating layer 403. The second conductive layer 420 may be covered by an upper insulating layer 405, and a lower insulating layer 401 may be arranged under the first conductive layer 410. The lower and intermediate insulating layers 401 and 403 may include an inorganic insulating layer such as silicon nitride. Alternatively, the lower and intermediate insulating layers 401 and 403 may include an organic insulating layer. The upper insulating layer 405 may include an organic insulating layer. Alternatively, the upper insulating layer 405 may include an inorganic insulating layer. The first and second conductive layers 410 and 420 may include a metal layer and/or a transparent conductive layer. The metal layer may include Mo, Mb, Ag, Ti, Cu, Al, and/or an alloy. The transparent conductive layer may include a transparent conductive oxide such as indium tin oxide (ITO), zinc oxide (IZO), zinc oxide (ZnO), and indium tin zinc oxide (ITZO). Besides, the transparent conductive layer may include a conductive polymer such as PEDOT, a metal nano-wire, a carbon nano-tube, and graphene.

Though it is shown in FIG. 9C that the lower insulating layer 401 is arranged between the thin-film encapsulation layer 300 and the first conductive layer 410, the lower insulating layer 401 may be omitted and the first conductive layer 410 may be directly located on the thin-film encapsulation layer 300 in an embodiment.

Figure 10A:
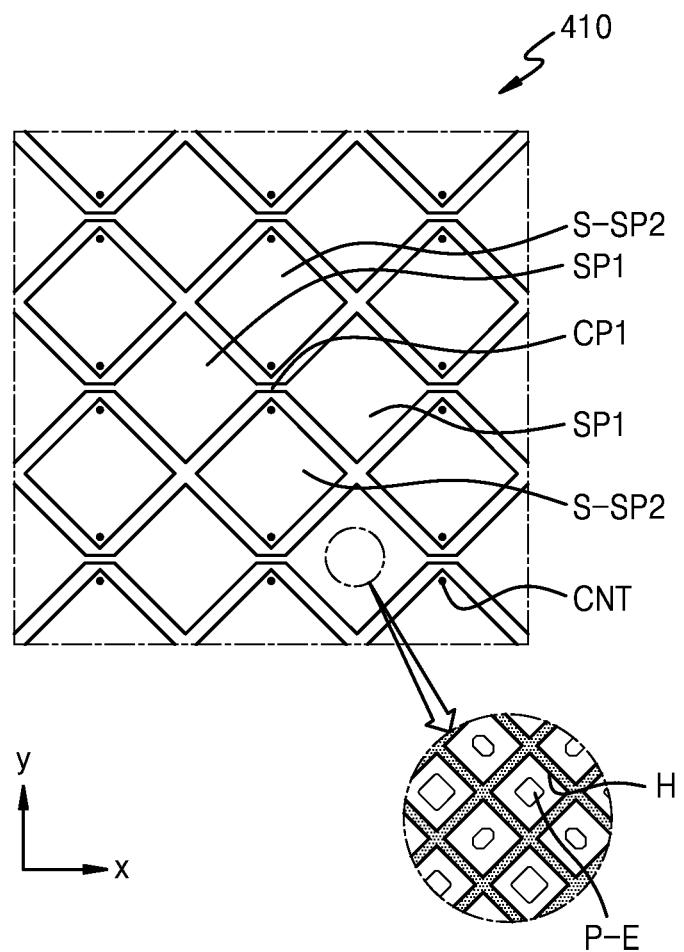
FIG. 10A is a plan view of a first conductive layer of an input sensing layer according to an embodiment.
Figure 10B:
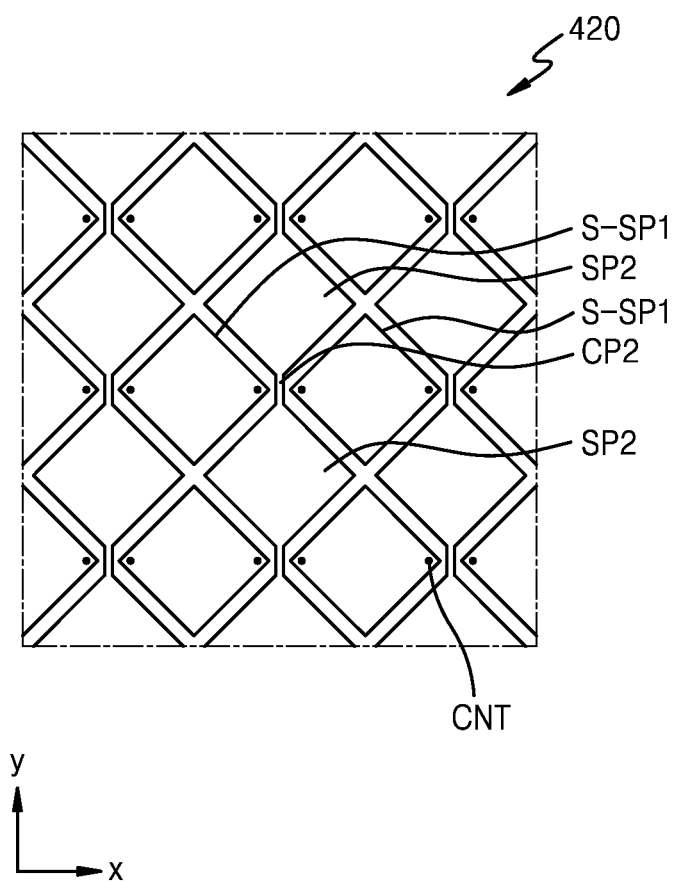
FIG. 10B is a plan view of a second conductive layer of an input sensing layer according to an embodiment.
Figure 10C:
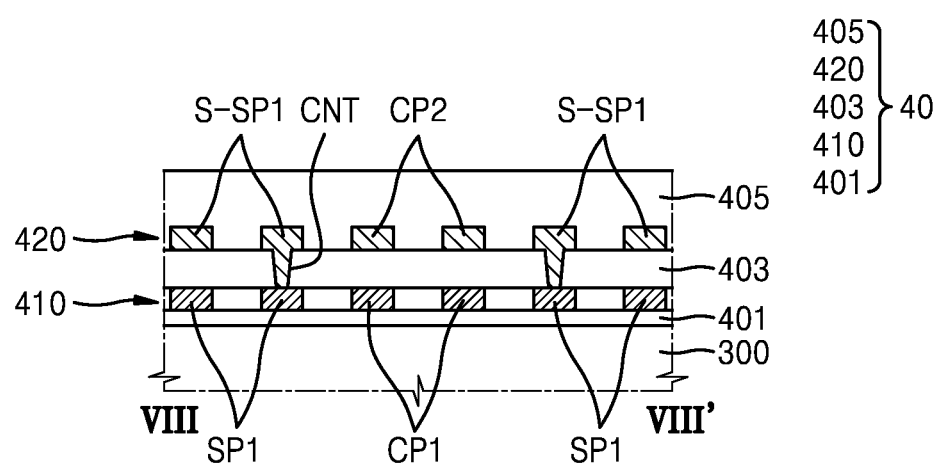
FIG. 10C is a cross-sectional view of an input sensing layer according to an embodiment.

FIGS. 10A and 10B are plan views of the first conductive layer 410 and the second conductive layer 420 of the input sensing layer 40 according to an embodiment, and FIG. 10C is a cross-sectional view of the input sensing layer 40 according to an embodiment and may correspond to a cross-section taken along line VIII-VIII' of FIG. 8.

Referring to FIGS. 10A and 10B, the first conductive layer 410 may include the first sensing electrodes SP1 and the first connection electrode CP1 connecting the first sensing electrodes SP1, and the second conductive layer 420 may include the second sensing electrodes SP2 and the second connection electrode CP2 connecting the second sensing electrodes SP2. The first conductive layer 410 may further include a second auxiliary sensing electrode S-SP2 connected to the second sensing electrode SP2, and the second conductive layer 420 may further include a first auxiliary sensing electrode S-SP1 connected to the first sensing electrode SP1.

Referring to the enlarged view of FIG. 10A, each of the first sensing electrodes SP1 may have a mesh structure including a plurality of holes H. The hole H may overlap an emission area P-E of a pixel. Though not shown, each of the second sensing electrode SP2, the first auxiliary sensing electrode S-SP1, and the second auxiliary sensing electrode S-SP2 may also have a mesh structure including a plurality of holes, each corresponding to an emission area P-E of a pixel as shown in the enlarged view of FIG. 10A.

Referring to FIG. 10C, the first auxiliary sensing electrode S-SP1 may be connected to the first sensing electrode SP1 through a contact hole CNT of the intermediate insulating layer 403 and may reduce a resistance of the first sensing electrode SP1 through this structure. Likewise, the second sensing electrode SP2 may be connected to the second auxiliary sensing electrode S-SP2 through a contact hole of the intermediate insulating layer 403. The lower and intermediate insulating layers 401 and 403 may include an inorganic insulating layer such as silicon nitride or an organic insulating layer. The upper insulating layer 405 may include an organic insulating layer or an inorganic insulating layer. The first and second conductive layers 410 and 420 may include a metal layer or a transparent conductive layer. The metal layer may include Mo, Mb, Ag, Ti, Cu, Al, and/or an alloy and may include a single layer or a multi-layer structure including the above materials. For example, the first and second conductive layers 410 and 420 may include a metal layer including three sub-layers of Ti/Al/Ti. The transparent conductive layer may include a transparent conductive layer, a conductive polymer, a metal nano wire, and/or graphene described above.

Figure 11A:
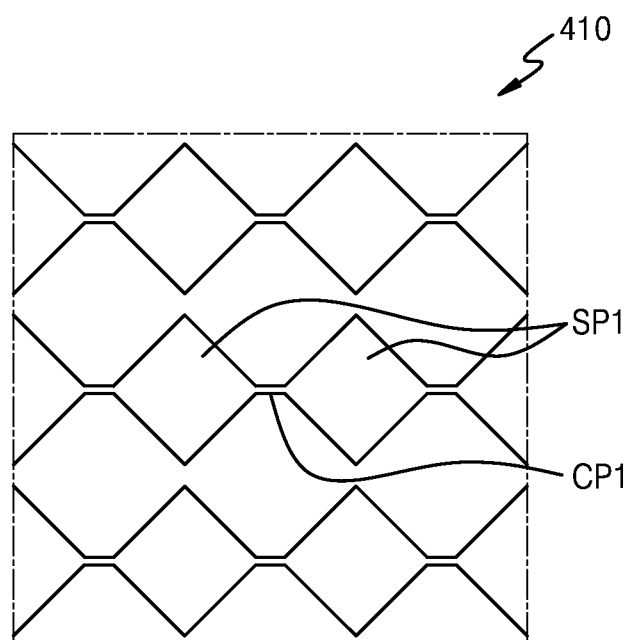
FIG. 11A is a plan view of a first conductive layer of an input sensing layer according to an embodiment.
Figure 11B:
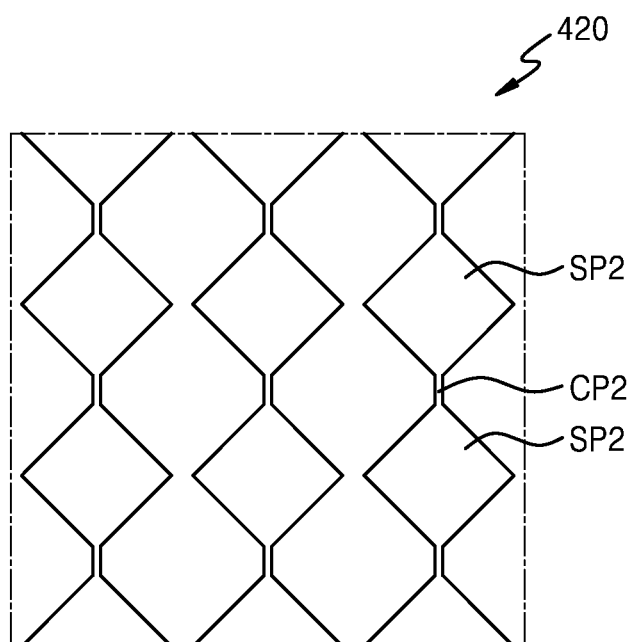
FIG. 11B is a plan view of a second conductive layer of an input sensing layer according to an embodiment.
Figure 11C:
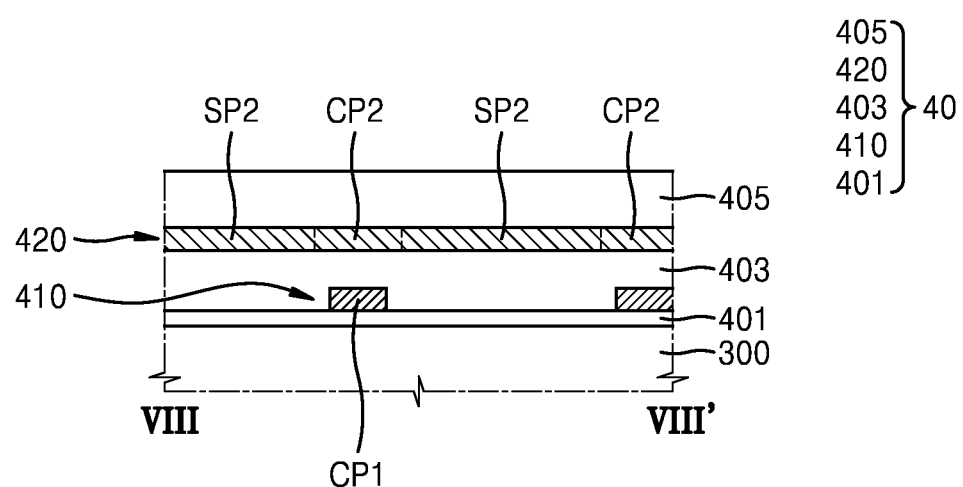
FIG. 11C is a cross-sectional view of an input sensing layer according to an embodiment.

FIGS. 11A and 11B are plan views of the first conductive layer 410 and the second conductive layer 420 of the input sensing layer 40 according to an embodiment, and FIG. 11C is a cross-sectional view of the input sensing layer 40 according to an embodiment and may correspond to a cross-section taken along line VIII-VIII' of FIG. 8.

Referring to FIGS. 11A and 11B, the first conductive layer 410 includes the first sensing electrodes SP1 and the first connection electrode CP1 connecting the first sensing electrodes SP1. The second conductive layer 420 includes the second sensing electrodes SP2 and the second connection electrode CP2 connecting the second sensing electrodes SP2.

Referring to FIG. 11C, the intermediate insulating layer 403 may be arranged between the first conductive layer 410 and the second conductive layer 420. The intermediate insulating layer 403 does not include a separate contact hole, and the first and second sensing electrodes SP1 and SP2 may be electrically insulated from each other with the intermediate insulating layer 403 between the electrodes SP1 and SP2. The second conductive layer 420 may be covered by the upper insulating layer 405. The lower insulating layer 401 including an inorganic material or an organic material may be further arranged under the first conductive layer 410.

The intermediate and upper insulating layers 403 and 405 may include an organic insulating layer or an inorganic insulating layer. The first and second conductive layers 410 and 420 may include a metal layer or a transparent conductive layer. The metal layer may include Mo, Mb, Ag, Ti, Cu, Al, and/or an alloy thereof. The transparent conductive layer may include a transparent conductive oxide such as indium tin oxide (ITO), zinc oxide (IZO), zinc oxide (ZnO), and indium tin zinc oxide (ITZO). Besides, the transparent conductive layer may include a conductive polymer such as PEDOT, a metal nano wire, a carbon nano tube, and/or graphene.

Figure 12:
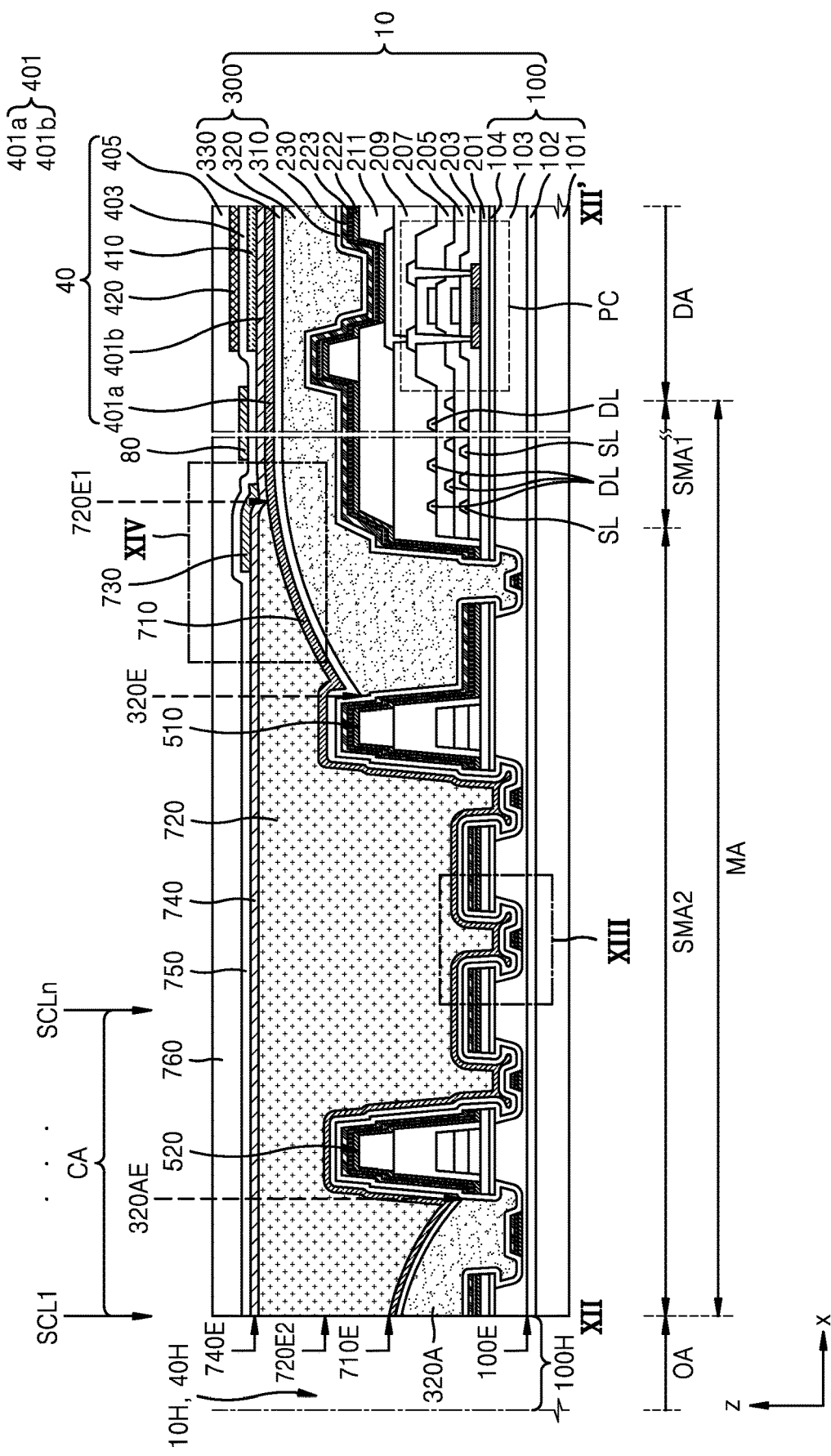
FIG. 12 is a cross-sectional view of a display device according to an embodiment.
Figure 13:
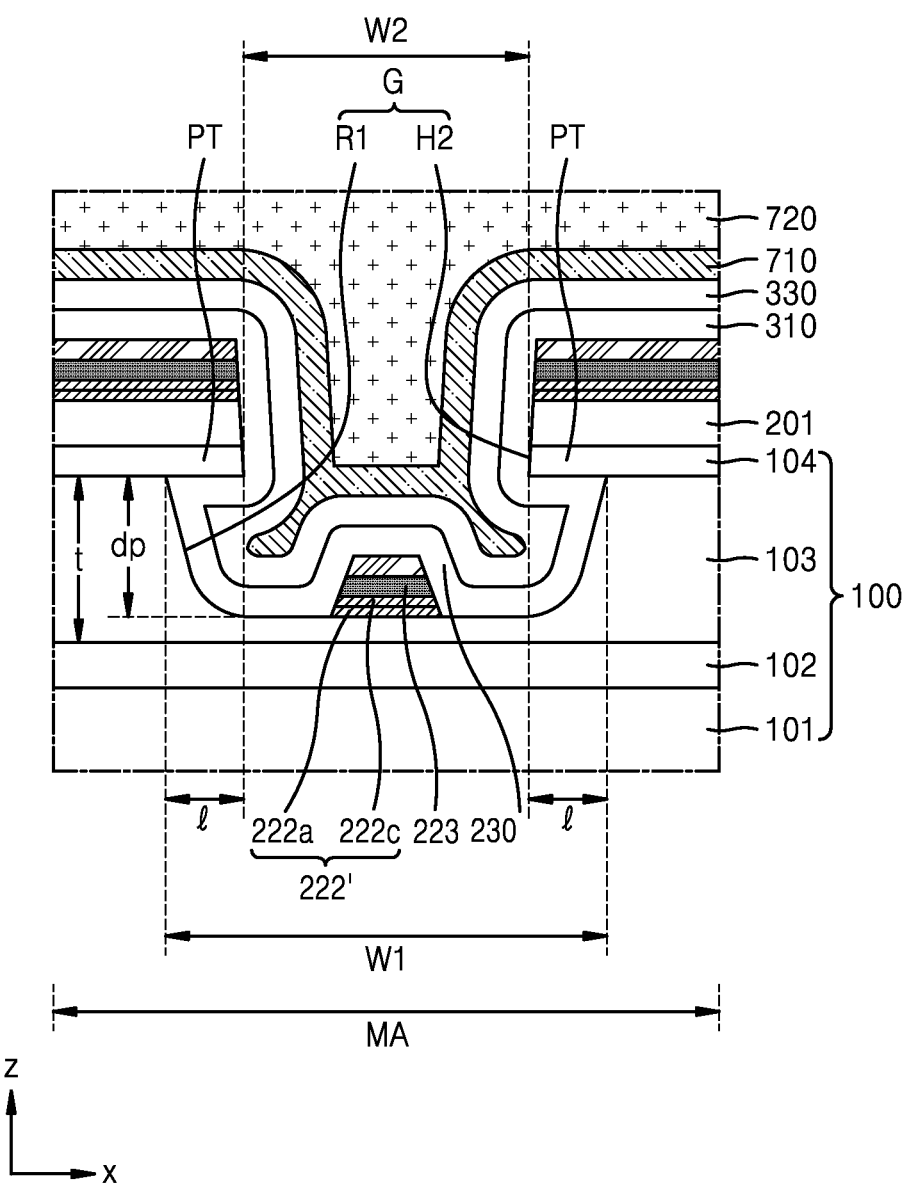
FIG. 13 is a cross-sectional view of region XIII of FIG. 12 according to an embodiment.
Figure 14:
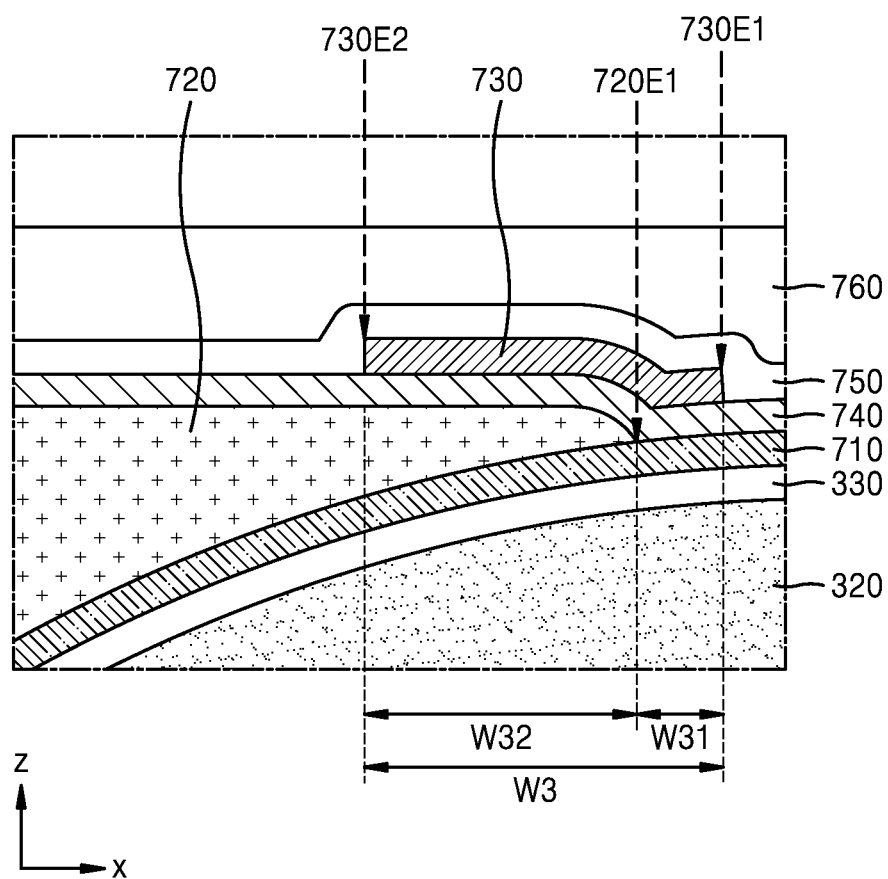
FIG. 14 is a cross-sectional view of a display device according to an embodiment and shows a cross-sectional view of a cover layer.
Figure 15:
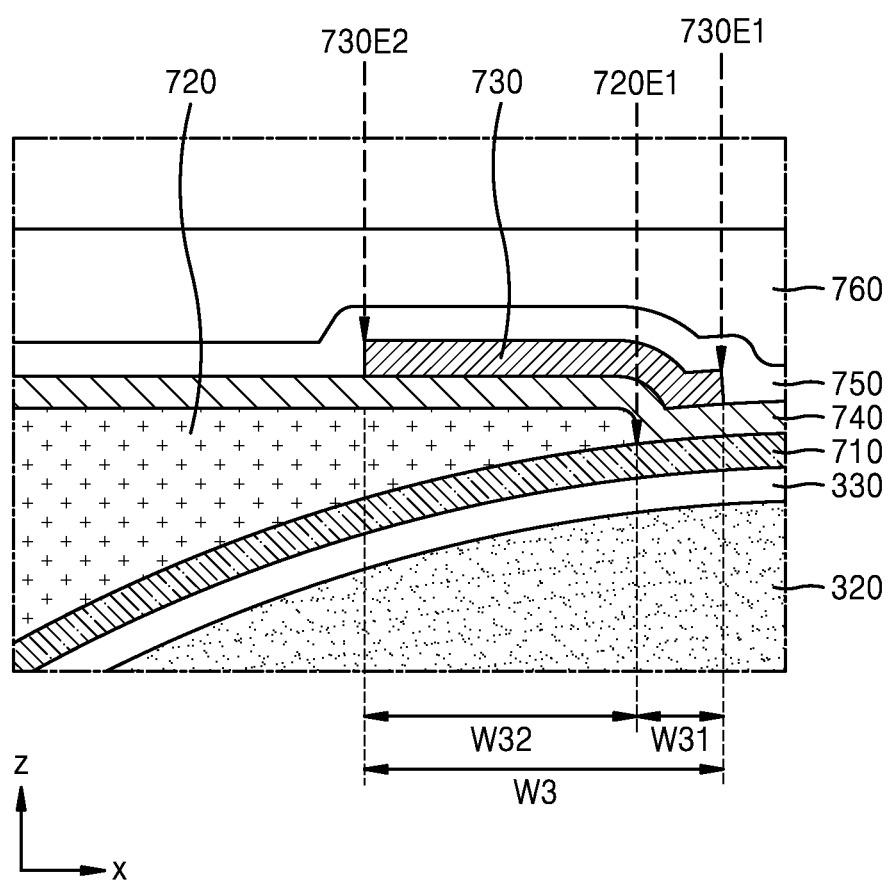
FIG. 15 is a cross-sectional view of a display device according to an embodiment and shows a cross-sectional view of a cover layer.
Figure 16:
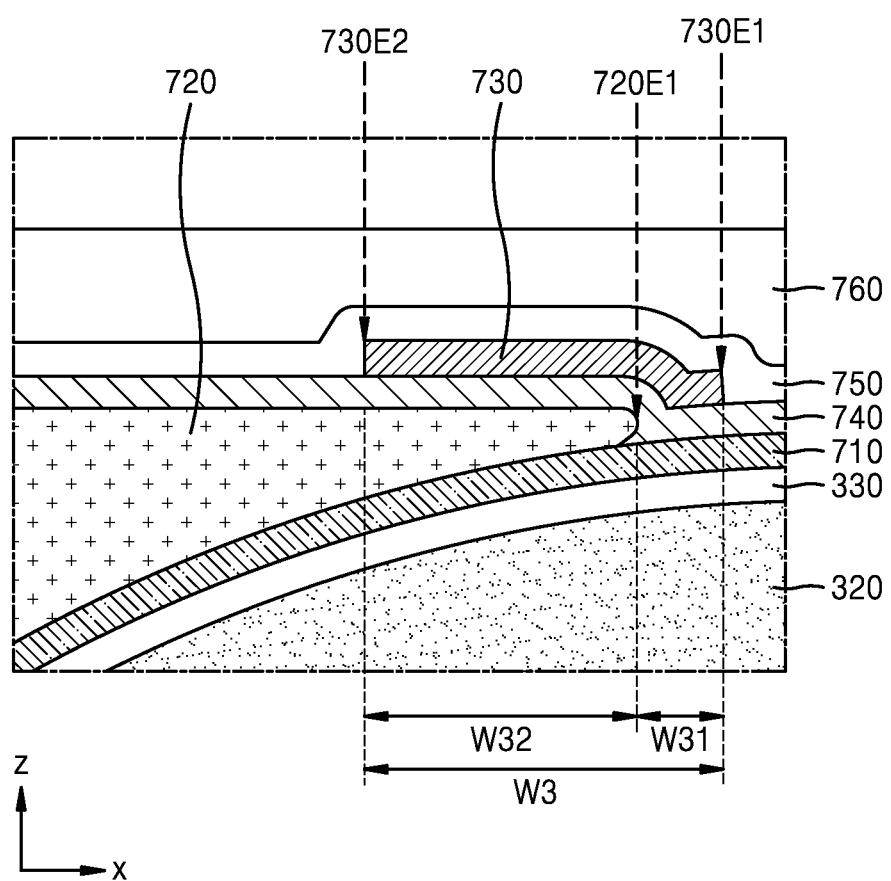
FIG. 16 is a cross-sectional view of a display device according to an embodiment and shows a cross-sectional view of a cover layer.
Figure 17:
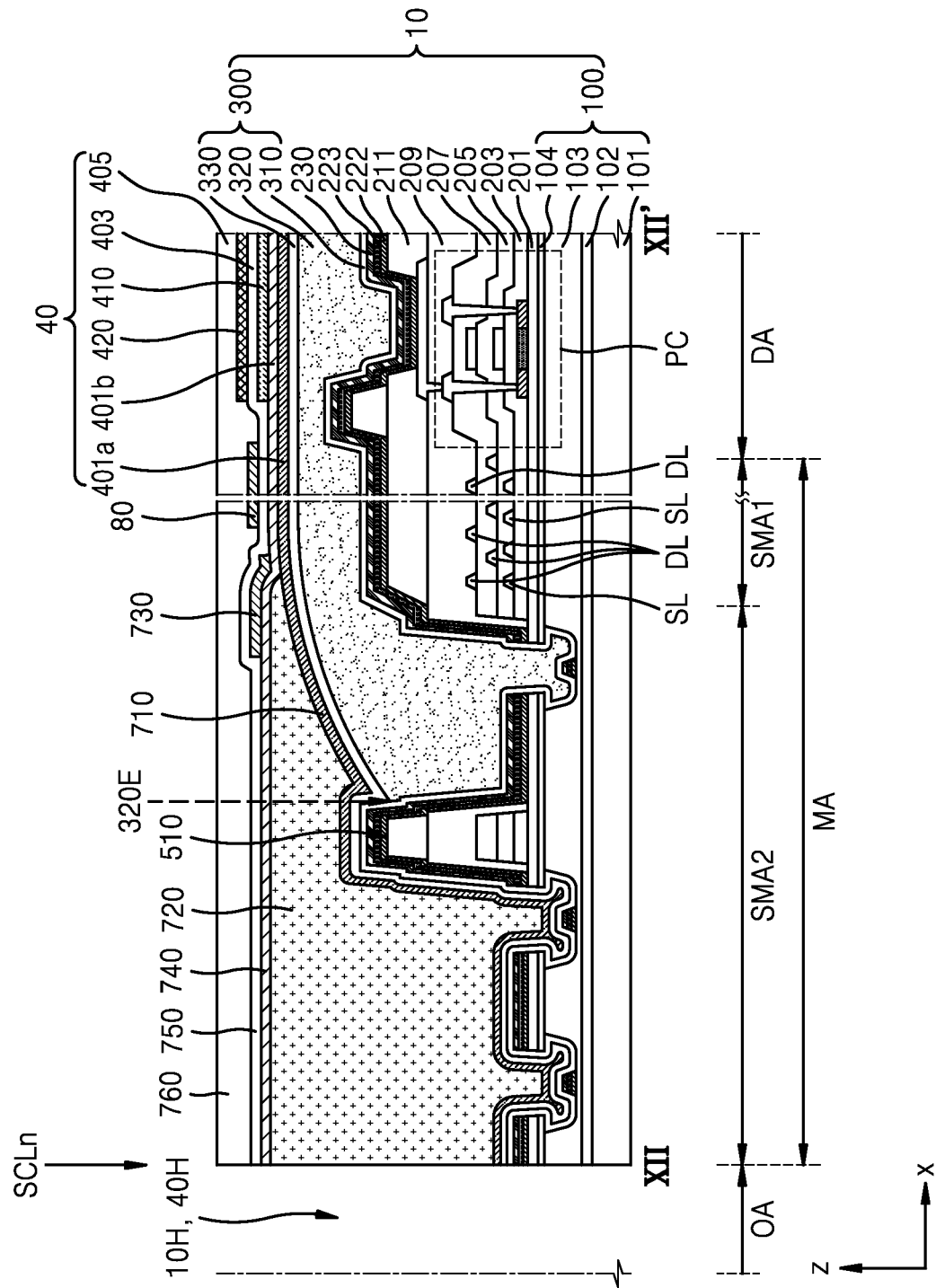
FIG. 17 is a cross-sectional view of a display device according to an embodiment.

FIG. 12 is a cross-sectional view of some layers of the display device 1 according to an embodiment and may correspond to a cross-section taken along line XII-XII' of FIG. 6, FIG. 13 is a cross-sectional view of region XIII of FIG. 12. Each of FIG. 14, FIG. 15, and FIG. 16 is a cross-sectional view of the display device 1 according to an embodiment and a shows a cross-sectional view of a cover layer 730. FIG. 17 is a cross-sectional view of the display device 1 according to an embodiment.

Referring to FIG. 12, the display panel 10 may include a first opening 10H corresponding to the first area OA. The display area DA includes the pixel circuit PC on the substrate 100, the pixel electrode 221 connected to the pixel circuit PC, and the intermediate layer 222 and the opposite electrode 223 sequentially stacked on the pixel electrode 221.

The substrate 100 may include a multi-layer structure. For example, the substrate 100 may include a first base layer 101, a first barrier layer 102, a second base layer 103, and a second barrier layer 104.

Each of the first and second base layers 101 and 103 may include a polymer resin, such as one of polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and cellulose acetate propionate (CAP). The polymer resin may be transparent.

Each of the first and second barrier layers 102 and 104 may include/be a barrier layer configured to prevent penetration of external foreign substances and include a single layer or a multi-layer structure including an inorganic material such as SiNx and/or SiOx.

The pixel circuit PC is arranged on the substrate 100 and includes a thin film transistor and a storage capacitor. An organic light-emitting diode including the pixel electrode 221, the emission layer of the intermediate layer 222, and the opposite electrode 223 emits predetermined light and is covered by the thin-film encapsulation layer 300. Elements arranged in the display area DA is the same as those described above with reference to FIG. 7.

Referring to the intermediate area MA of FIG. 12, the intermediate area MA may include a first sub-intermediate area SMA1 that is relatively adjacent to the display area DA, and a second sub-intermediate area SMA2 that is relatively adjacent to the first area OA or the first opening 10H.

The first sub-intermediate area SMA1 may be an area across which lines, for example, the data lines DL described with reference to FIG. 5, pass. The data lines DL shown in FIG. 12 may correspond to data lines detouring or bypassing around the first area OA. The first sub-intermediate area SMA1 may include a wiring area or a detour area across which the data lines DL pass. A width of the first sub-intermediate area SMA1 may be equal to, less than, or greater than a width of the second sub-intermediate area SMA2.

As shown in FIG. 12, the data lines DL may be insulated by an insulating layer. In the case where neighboring data lines DL are arranged over and under an insulating layer (e.g. the second interlayer insulating layer 207) such that the insulating layer being neighboring data lines DL, a gap (a pitch) between the adjacent data lines DL may be reduced and a width of the intermediate area MA may be reduced. In an embodiment, the data lines DL may be arranged on the same insulating layer (e.g. the second interlayer insulating layer 207). Though it is shown in FIG. 12 that the data lines DL are located in the first sub-intermediate area SMA1, the scan lines detouring around the first area OA described above with reference to FIG. 5 may be also located in the first sub-intermediate area SMA1. A shield layer 80 may be arranged over the data lines DL and/or the scan lines located in the first sub-intermediate area SMA1. The shield layer 80 may overlap the data lines DL and/or the scan lines to prevent the data lines DL and/or the scan lines from being viewed by a user. In an embodiment, the shield layer 80 may include metal.

The second sub-intermediate area SMA2 is a groove area in which grooves are arranged. Though FIG. 12 shows five grooves located in the second sub-intermediate area SMA2, the number of grooves may be configured according to embodiments.

Each of the grooves G may be formed in a multi-layer structure including a first layer and a second layer respectively including different materials. In an embodiment, it is shown in FIG. 12 that each groove G is formed in sub-layers provided in the substrate 100.

Referring to FIGS. 12 and 13, a groove G may be formed by removing a portion of the second barrier layer 104 and a portion of the second base layer 103. A hole H2 passing through the second barrier layer 104 and a recess R1 formed in the second base layer 103 may be spatially connected to constitute the groove G. The second base layer 103 may correspond to the first layer of the multi-layer structure, and the second barrier layer 104 may correspond to the second layer of the multi-layer structure.

During a process of forming the groove G, a portion of the buffer layer 201 on the second barrier layer 104 may be substantially simultaneously removed with the second barrier layer 104 to form the second hole H2. In an embodiment, the buffer layer 201 on the substrate 100 may be a sub-layer of the second barrier layer 104 having a multi-layered structure.

A width of a portion of the groove G that passes through the second barrier layer 104, for example, the second hole H2, may be less than a width of a portion of the groove G that passes through the second base layer 103, for example, the recess R1. The width W2 (or a diameter) of the second hole H2 may be less than the width W1 (or a diameter) of the recess R1, and the groove G may have an undercut cross-section.

A lateral surface of the second barrier layer 104 defining the second hole H2 may protrude toward a center of the groove G relative to a lateral surface of the second base layer 103 defining the recess R1. Portions of the second barrier layer 104 that protrude toward the center of the groove G may constitute a pair of eaves (or a pair of protruding tips, or tips PT). Not only the second barrier layer 104 but also the buffer layer 201 may constitute a pair of eaves.

The groove G may be formed before a process of forming the intermediate layer 222. A portion (e.g., one or more sub-layers) 222' of the intermediate layer 222 (which may include the first and/or second functional layers 222a and 222c) extending to the intermediate area MA may be disconnected from other portions of the intermediate layer 222 and may be located inside the groove G. Portions of the material layers of the opposite electrode 223 and the capping layer 230 including LiF may be disconnected from other portions of the material layers and may be located inside the groove G. A length l of each of a pair of tips PT may be less than 2.0 µm. In an embodiment, the length l may be in a range of about 1.0 µm to about 1.8 µm.

Though it is shown in FIGS. 12 and 13 that a bottom surface of the groove G is located on a virtual plane located between a bottom surface and a top surface of the second base layer 103, the bottom surface of the groove G may be located on the same plane as the bottom surface of the second base layer 103 in an embodiment. For example, during an etching process of forming the groove G, a depth dp of the recess R1 may be substantially the same as a thickness t of the second base layer 103. In an embodiment, the bottom surface of the groove G may be placed on the same plane as the bottom surface of the second base layer 103. The depth dp of the recess R1 may be 2.0 µm or more, 2.5 µm or more, or 2.0 µm or more. In the case where the depth dp of the recess R1 is the same as the thickness t of the second base layer 103, the recess R1 may be a hole that passes through the second base layer 103.

As shown in FIG. 12, the thin-film encapsulation layer 300 covering the display elements in the display area DA may extend to cover the intermediate area MA. For example, the first and second inorganic encapsulation layers 310 and 330 may extend to the intermediate area MA. The first and second inorganic encapsulation layers 310 and 330 may be formed by CVD, etc. and may have relatively excellent step coverage compared to the portion 222' of the intermediate layer 222 or the opposite electrode 223. Therefore, each of the first and second inorganic encapsulation layers 310 and 330 may be continuously formed without being disconnected around the groove G. The first inorganic encapsulation layer 310 may cover an inner surface of the groove G. The first and second inorganic encapsulation layers 310 and 330 may have different thicknesses. For example, the first inorganic encapsulation layer 310 may have a thickness of about 1 µm, and the second inorganic encapsulation layer 330 may have a thickness of about 0.7 µm, which is less than the thickness of the first inorganic encapsulation layer 310. Alternatively, the thickness of the first inorganic encapsulation layer 310 and the thickness of the second inorganic encapsulation layer 330 may be the same, or the thickness of the first inorganic encapsulation layer 310 may be greater than the thickness of the second inorganic encapsulation layer 330.

Though FIGS. 12 and 13 show the structure in which the capping layer 230 including LiF is disconnected around the groove G, the capping layer 230 may continuously cover the inner surface of the groove G without being disconnected around the groove G in an embodiment.

As shown in FIG. 12, the organic encapsulation layer 320 may cover the display area DA, and an end 320E of the organic encapsulation layer 320 may be located on one side of a first partition wall 510. The organic encapsulation layer 320 may be formed by coating and hardening a monomer. A flow of the monomer may be controlled by the first partition wall 510, and a thickness of the organic encapsulation layer 320 may be controlled by the first partition wall 510. Alternatively, the organic encapsulation layer 320 may be formed by coating a polymer. Since the organic encapsulation layer 320 is spaced from the first area OA, external moisture that has penetrated through the first opening 10H may be prevented from propagating to the organic light-emitting diode of the display area DA through the organic encapsulation layer 320.

The first partition wall 510 may include a plurality of layers. FIG. 12 shows that the first partition wall 510 has a stacked structure including layers including the same materials as those of the gate insulating layer 203, the first interlayer insulating layer 205, and the second interlayer insulating layer 207, and layers including the same materials as those of the planarization insulating layer 209 and the pixel-defining layer 211. In an embodiment, the number of layers constituting the first partition wall 510 may be greater or less than the number of layers shown in FIG. 12.

An organic material layer 320A is adjacent to the first area OA and is spaced from the organic encapsulation layer 320 by a predetermined interval. The organic material layer 320A may be formed during the same process as a process of forming the organic encapsulation layer 320 and may include the same material as that of the organic encapsulation layer 320. Like the flow of the monomer is adjusted by the first partition wall 510 during a process of forming the organic encapsulation layer 320, the organic material layer 320A may be adjusted by a second partition wall 520, and an end 320AE of the organic material layer 320A may be located on one side of the second partition wall 520. As shown in FIG. 12, a portion of the first inorganic encapsulation layer 310 and a portion of the second inorganic encapsulation layer 330 may be located in the intermediate area MA and may contact each other. If a contact area between the first inorganic encapsulation layer 310 and the second inorganic encapsulation layer 330 becomes a specific value or more, the first inorganic encapsulation layer 310 and the second inorganic encapsulation layer 330, or a neighboring layer, for example, a planarization layer 720 may be floating. According to an embodiment, since the organic material layer 320A is arranged, the contact area between the first inorganic encapsulation layer 310 and the second inorganic encapsulation layer 330 may be reduced and thus the floating of the neighboring layer may be prevented or minimized. The organic material layer 320A may be spaced from the organic encapsulation layer 320, and the first inorganic encapsulation layer 310 and the second inorganic encapsulation layer 330 may contact each other between the end 320E of the organic encapsulation layer 320 and the end 320AE of the organic material layer 320A.

The planarization layer 720 may be arranged in the intermediate area MA. The planarization layer 720 may include an organic insulating layer. The planarization layer 720 may include a polymer-based material. For example, the planarization layer 720 may include one of a silicon-based resin, an acrylic-based resin, an epoxy-based resin, polyimide, and polyethylene. The polymer-based material may be transparent. In an embodiment, the planarization layer 720 may include a material different from that of the organic encapsulation layer 320. For example, the organic encapsulation layer 320 may include a silicon-based resin, and the planarization layer 720 may include an acrylic-based resin. In an embodiment, the organic encapsulation layer 320 and the planarization layer 720 may include the same material.

The planarization layer 720 may cover at least one groove G located in the intermediate area MA. The planarization layer 720 may increase the flatness of the display panel 10 around the first area OA by covering an area that is not covered by at least the organic encapsulation layer 320 in the intermediate area MA. Therefore, separation or floating of the input sensing layer 40 (see FIG. 2) and/or the optical functional layer 50 (see FIG. 2) from the display panel 10 may be prevented. A portion of the planarization layer 720 may overlap the organic encapsulation layer 320. One end of the planarization layer 720, for example, a first end (first edge) 720E1 adjacent to the display area DA may be located on the organic encapsulation layer 320.

The planarization layer 720 may be formed in the intermediate area MA through exposure and developing processes, etc. The planarization layer 720 may be only located in the intermediate area MA. In the case where external foreign substances, for example, moisture propagates in a lateral direction (e.g. a direction parallel to an xy-plane) of the display panel 10 during some (e.g. a washing process) of processes of forming the planarization layer 720, the organic light-emitting diode of the display area DA may be damaged. In embodiments, since insulating layers, for example, a first insulating layer 710 and a second insulating layer 740 are respectively arranged under and over the planarization layer 720, the moisture penetration issue and/or floating of a neighboring layer may be prevented during or after the process of forming the planarization layer 720.

The first insulating layer 710 may be arranged right under the planarization layer 720. The planarization layer 720 may directly contact a top surface of the first insulating layer 710. The first insulating layer 710 may include an inorganic insulating material such as silicon oxide (SiOx), silicon nitride (SiNx), and/or silicon oxynitride (SiON). The first insulating layer 710 may directly contact the thin-film encapsulation layer 300. For example, the first insulating layer 710 may directly contact a top surface of the second inorganic encapsulation layer 330. The first insulating layer 710 may include the same material as that of the second inorganic encapsulation layer 330 or include a material different from that of the second inorganic encapsulation layer 330. For example, even when the first insulating layer 710 includes silicon nitride, as that of the second inorganic encapsulation layer 330, a specific composition ratio (e.g. a content ratio of silicon and nitrogen) may be different, and an interface may be formed between the first insulating layer 710 and the second inorganic encapsulation layer 330. A thickness of the first insulating layer 710 may be less than a thickness of the second inorganic encapsulation layer 330. Alternatively, the thickness of the first insulating layer 710 may be the same as or greater than the thickness of the second inorganic encapsulation layer 330.

The second insulating layer 740 may be arranged on the planarization layer 720, for example, directly on the planarization layer 720. The second insulating layer 740 may include an inorganic insulating material such as silicon oxide (SiOx), silicon nitride, and/or silicon oxynitride. The first insulating layer 710 and the second insulating layer 740 may include the same material or different materials. A thickness of the second insulating layer 740 may be greater than the thickness of the first insulating layer 710. Alternatively, the thickness of the second insulating layer 740 may be less than or the same as the thickness of the first insulating layer 710.

The planarization layer 720 may form a step difference with respect to an underlying layer. Referring to FIGS. 12 and 14, the first end 720E1 of the planarization layer 720 may form a step difference with respect to an underlying layer, for example, the first insulating layer 710. To prevent the first end 720E1 of the planarization layer 720 from being separated or floating from an underlying layer due to the step difference during an operation of manufacturing the display panel 10 and/or while using the display panel 10 after the manufacturing, the first end 720E1 of the planarization layer 720 may be covered (and secured) by the cover layer 730. In an embodiment, when the second insulating layer 740 is disposed between the planarization layer 720 and the cover layer 730, the first end 720E1 of the planarization layer 720 may be also covered by the second insulating layer 740.

The cover layer 730 may include a material different from those of the first and second insulating layers 710 and 740. For example, the cover layer 730 may be formed during the same process as a process of forming at least one conductive layer of the input sensing layer 40 described above with reference to one or more of FIGS. 8 to 110. For example, the cover layer 730 may formed during the same process as a process of forming the first conductive layer 410 or the second conductive layer 420 of the input sensing layer 40. The cover layer 730 may include the same material as that of the first conductive layer 410 or the second conductive layer 420 of the input sensing layer 40 located in the display area DA. In an embodiment, the cover layer 730 may include a metal layer.

FIG. 14 shows that an end of the planarization layer 720 including the first end 720E1 has a forward tapered inclination (e.g. an inclination angle is an acute angle) with respect to the top surface of the first insulating layer 710. In an embodiment, as shown in FIG. 15, an end of the planarization layer 720 including the first end 720E1 may have an inclination angle of about 90° with respect to the top surface of the first insulating layer 710. Alternatively, as shown in FIG. 16, the end of the planarization layer 720 including the first end 720E1 may have a reversely tapered inclination with respect to the top surface of the first insulating layer 710. The end of the planarization layer 720 having the inclination angle shown in FIGS. 16 and 17 is also covered by the second insulating layer 740 and/or the cover layer 730. Separation or floating of the planarization layer 720 due to a step difference between the first end 720E1 of the planarization layer 720 and the first insulating layer 710 may be prevented.

A third width W3 of the cover layer 730 may be tens of μm to hundreds of μm. For example, the third width W3 of the cover layer 730 may be about 50 μm to about 500 μm, or may be about 50 μm to about 400 μm, or may be about 50 μm to 300 μm, or may be about 50 μm to 200 μm, or may be about 60 μm to 100 μm.

The cover layer 730 may be located over the planarization layer 720. For example, as shown in FIGS. 12 to 16, the cover layer 730 may be located directly on the second insulating layer 740. A first end 730E1 of the cover layer 730 may extend toward the display area DA beyond the first end 720E1 of the planarization layer 720, and thus a first portion of the cover layer 730 including the first end 730E1 does not overlap the planarization layer 720. A second end 730E2 of the cover layer 730, which is opposite to the first end 730E1, may extend toward the first area OA on the planarization layer 720 and thus a second portion of the cover layer 730 including the second end 730E2 may overlap the planarization layer 720. A width W31 of the first portion of the cover layer 730 may be less than a width W32 of the second portion of the cover layer 730. For example, the width W31 of the first portion of the cover layer 730 may be about 20 μm, and the width W32 of the second portion of the cover layer 730 may be about 60 μm.

A third insulating layer 750 and a fourth insulating layer 760 may be arranged on the cover layer 730. The third insulating layer 750 may include an inorganic insulating material such as silicon oxide (SiOx), silicon nitride (SiNx), and/or silicon oxynitride (SiON). Alternatively, the third insulating layer 750 may include an organic insulating material. The fourth insulating layer 760 may include an inorganic insulating material or an organic insulating material. The fourth insulating layer 760 including an organic insulating material may have a relatively flat top surface. The organic insulating material may include a photoresist (negative or positive) or a polymer-based organic material.

At least one of the first insulating layer 710, the second insulating layer 740, the third insulating layer 750, or the fourth insulating layer 760 may include the same material as that of an insulating layer included in the input sensing layer 40 described above with reference to one or more of FIGS. 8 to 110. In an embodiment, each of the first insulating layer 710, the second insulating layer 740, the third insulating layer 750, and the fourth insulating layer 760 may be substantially simultaneously formed during the same process as a process of forming at least one insulating layer of the input sensing layer 40 described above with reference to one or more of FIGS. 8 to 110. For example, as shown in FIG. 12, the first insulating layer 710 may include the same material as that of a first sub-lower insulating layer 401a, which is a portion of the lower insulating layer 401 of the input sensing layer 40, and may be formed as one body with the first sub-lower insulating layer 401a of the input sensing layer 40. The second insulating layer 740 may include the same material as that of a second sub-lower insulating layer 401b, which is a portion of the lower insulating layer 401, and may be formed as one body with the second sub-lower insulating layer 401b. The third insulating layer 750 may include the same material as that of the intermediate insulating layer 403 of the input sensing layer 40 and may be formed as one body with the intermediate insulating layer 403. The fourth insulating layer 760 may include the same material as that of the upper insulating layer 405 of the input sensing layer 40 and may be formed as one body with the upper insulating layer 405. In an embodiment, the first insulating layer 710, the second insulating layer 740, and the third insulating layer 750 may include an inorganic insulating material, and the fourth insulating layer 760 may include an organic insulating material.

The first and second openings 10H and 40H of the display device 1 may be formed by performing a cutting or scribing process after forming the above-described elements and layers over the substrate 100. The cutting or scribing process may be performed along a first line SCL1. An end of layers arranged over the substrate 100 around the first area OA may be aligned with an end 100E of the substrate 100 defining the first opening 10H. An end of layers arranged over the substrate 100 around the first area OA may be located on the same vertical line as an end 100E of the substrate 100 defining the first opening 10H. For example, the end 710E of the first insulating layer 710, a second end 720E2 of the planarization layer 720, and an end 740E of the second insulating layer 740 may be located on the same vertical line as the end 100E defining an opening 100H of the substrate 100. Likewise, ends of the first and second inorganic encapsulation layers 310 and 330, the organic material layer 320A, and the third and fourth insulating layers 750 and 760 may be located on the same vertical line as the end 100E of the substrate 100.

An area from the first line SCL1 to an n-th line SCLn shown in FIG. 12 may include an area CA across which a laser may pass during a cutting or scribing process in manufacturing the display panel 10. The cutting or scribing process may be performed along one of the first line SCL1 to the n-th line SCLn. FIG. 17 shows a cross-sectional structure of the display panel 10 on which a cutting or scribing process has been performed along the n-th line SCLn.

Figure 18:
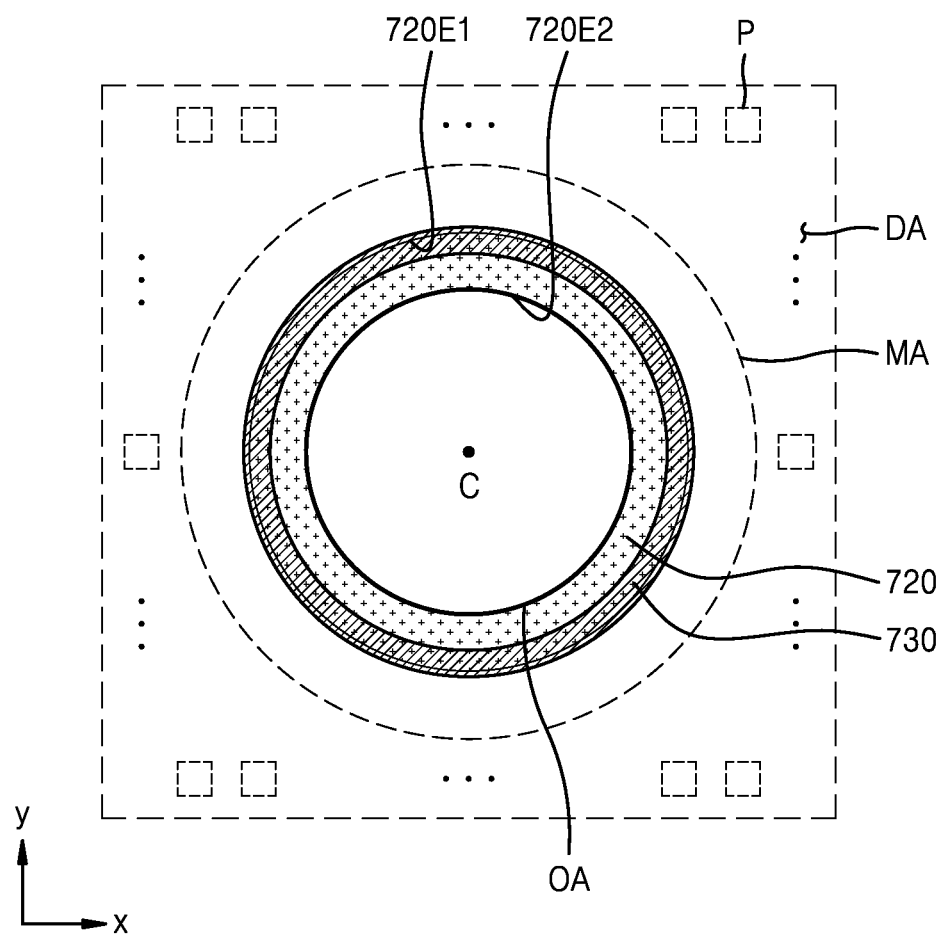
FIG. 18 is a plan view of a first area and a neighborhood of the first area of a display device according to an embodiment.

The cross-sectional structure shown in FIGS. 12 and 16 may represent a structure surrounding the first area OA. For example, the grooves G between the first area OA and the display area DA may have a ring shape surrounding the first opening 10H and the first area OA as described above with reference to FIG. 6. Likewise, in a plan view, the planarization layer 720 of FIG. 12 may have a ring shape surrounding the first opening 10H and the first area OA. FIG. 18 shows the planarization layer 720.

FIG. 18 is a plan view of the first area OA and a neighborhood of the first area OA of the display device 1 according to an embodiment and shows the planarization layer 720 and the cover layer 730.

Referring to FIG. 18, the planarization layer 720 may have a ring shape surrounding the first area OA. The planarization layer 720 may be located in the intermediate area MA, and the second end 720E2 of the planarization layer 720 may be substantially the same as a perimeter of the first area OA in a plan view.

The cover layer 730 may at least partially cover the first end 720E1 of the planarization layer 720. FIG. 17 shows that the cover layer 730 has a ring shape surrounding the first area OA and entirely covers the first end 720E1 of the planarization layer 720. In an embodiment, the cover layer 730 may partially cover the first end 720E1 of the planarization layer 720 and have a shape partially surrounding the first area OA in a plan view.

The cover layer 730 may include the same material as that of one of the conductive layers included in the input sensing layer 40 (see FIG. 12) and may be located on the same layer on which one of the conductive layers included in the input sensing layer 40 (see FIG. 12) is arranged.

Figure 19:
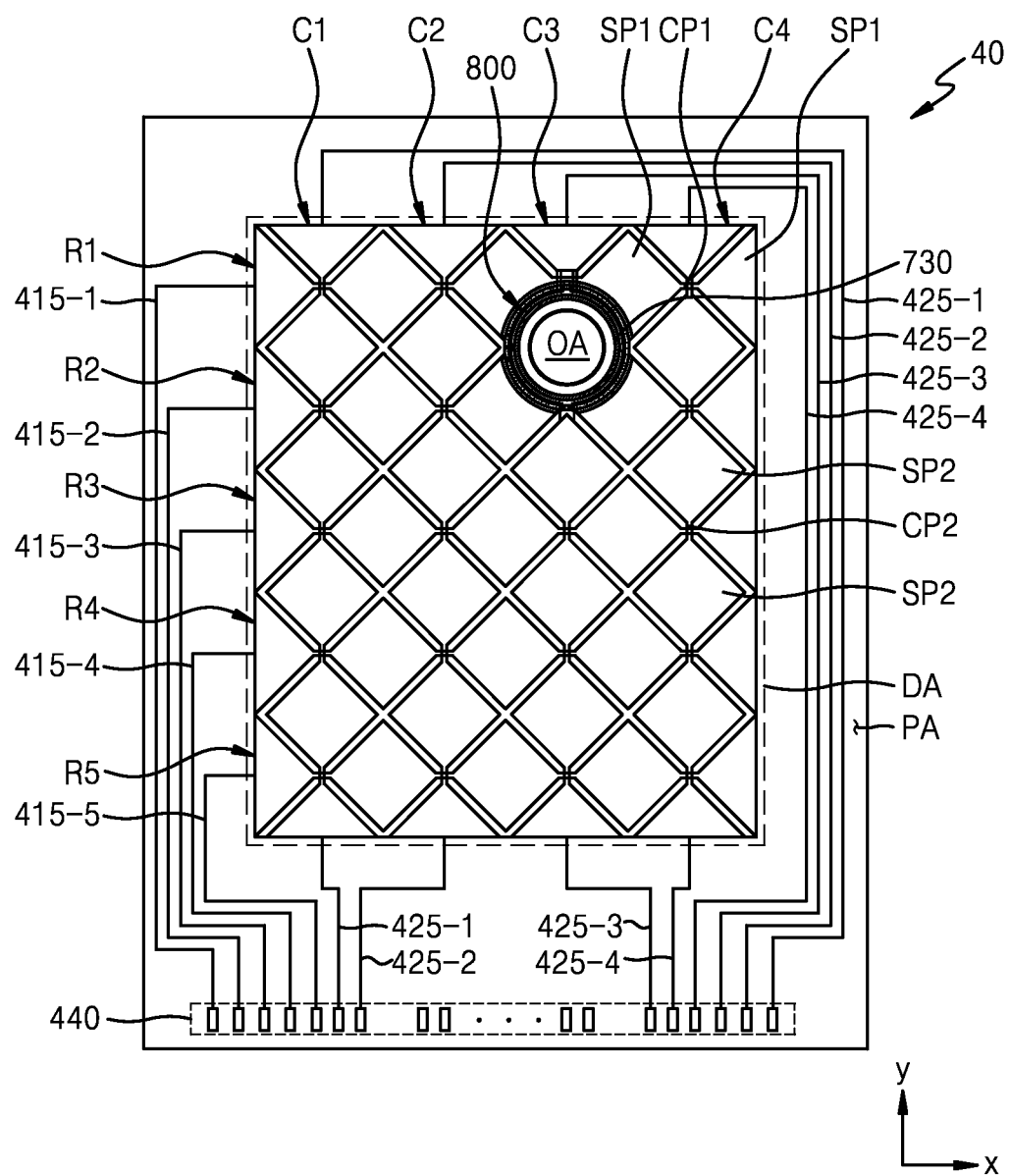
FIG. 19 is a plan view of an input sensing layer of a display device according to an embodiment.
Figure 20:
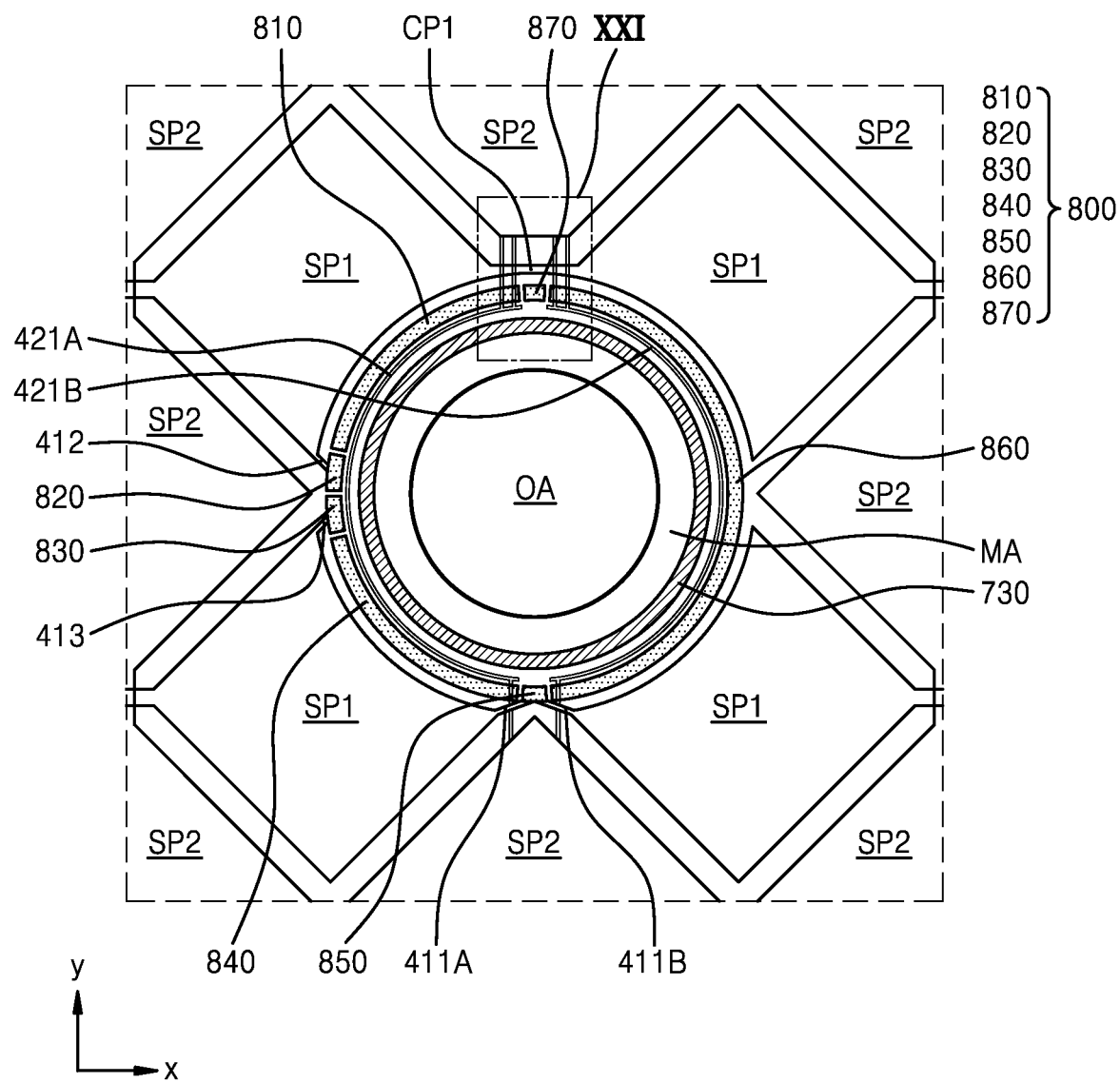
FIG. 20 is a plan view of a first area and a neighborhood of the first area in FIG. 19 according to an embodiment.
Figure 21:
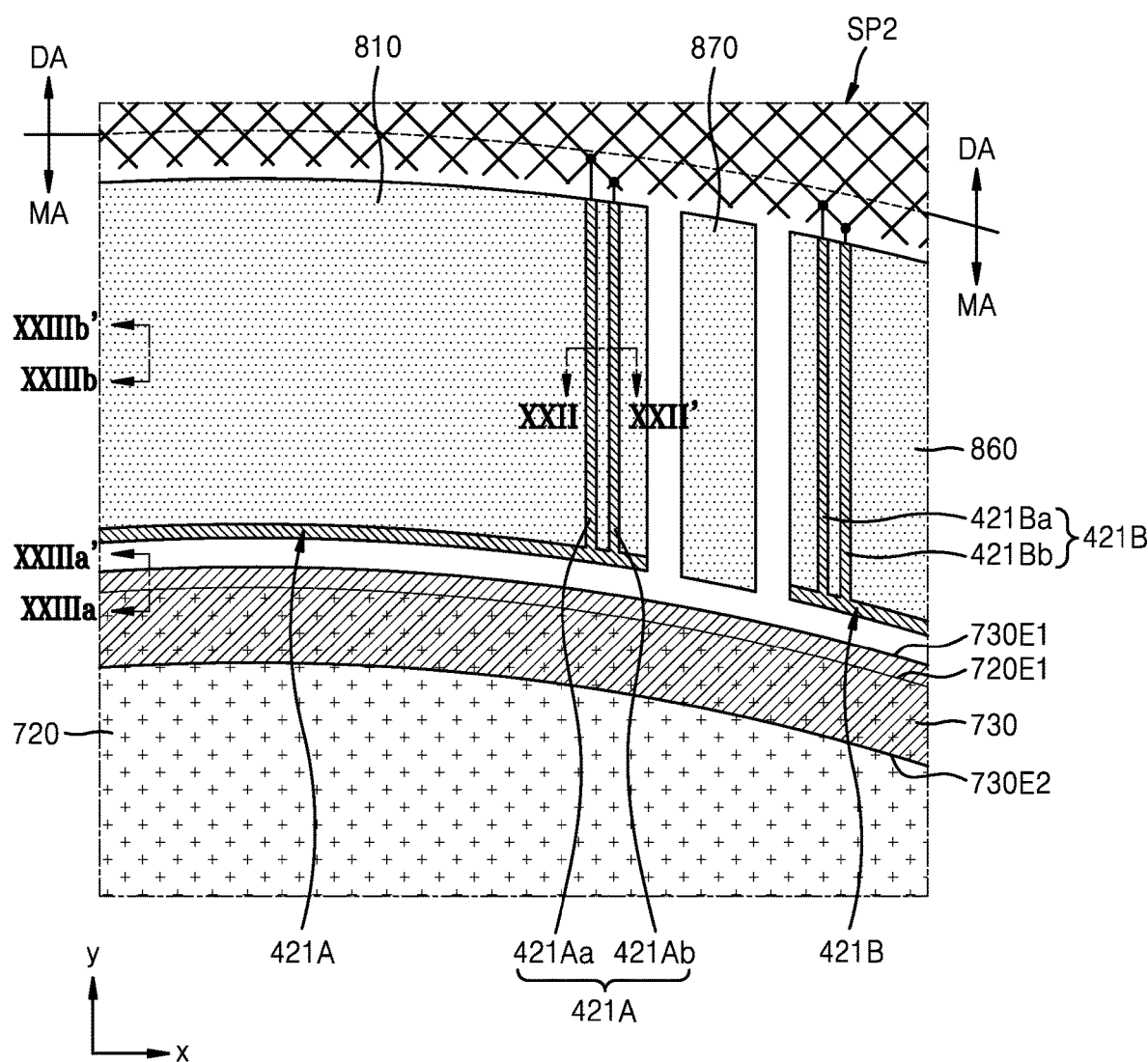
FIG. 21 is a plan view of a portion of FIG. 20 according to an embodiment.
Figure 22:
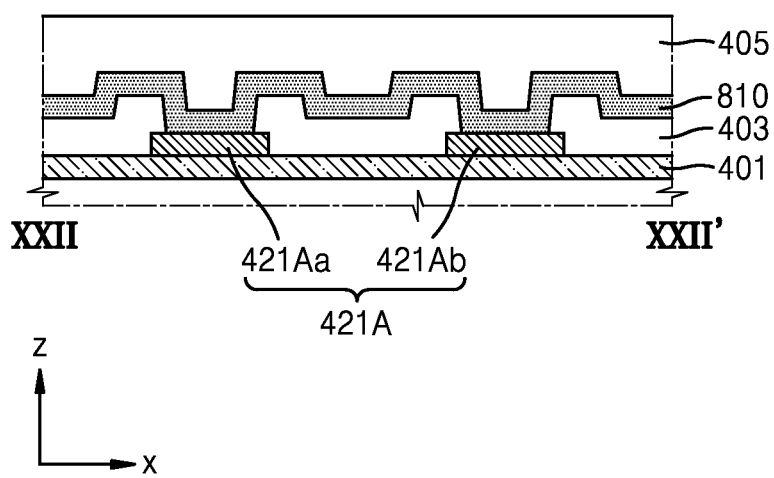
FIG. 22 is a cross-sectional view taken along line XXII-XXII' of FIG. 21 according to an embodiment.
Figure 23:
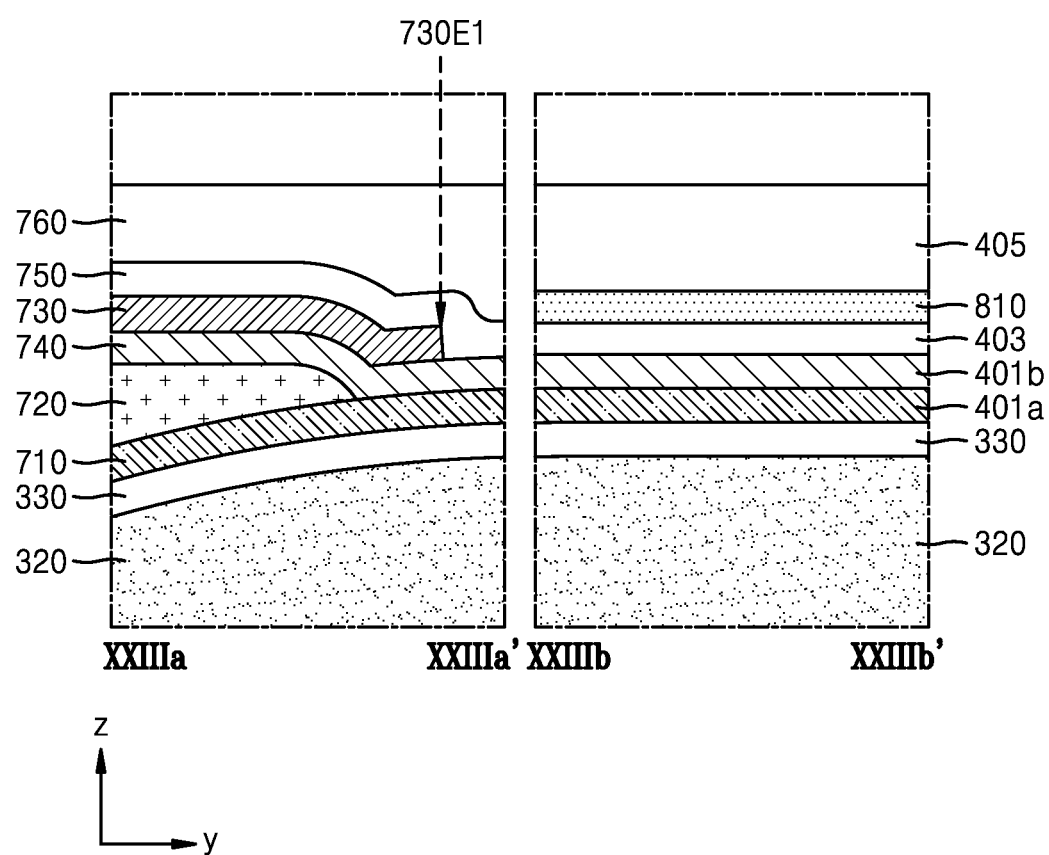
FIG. 23 is a cross-sectional view taken along lines XXIIIa-XXIIIa' and XXIIIb-XXIIIb' of FIG. 21 according to an embodiment.

FIG. 19 is a plan view of the input sensing layer 40 of the display device 1 according to an embodiment, FIG. 20 is a plan view of the first area OA and a neighborhood of the first area OA in FIG. 19, FIG. 21 is a plan view of a portion of FIG. 20, FIG. 22 is a cross-sectional view taken along line XXII-XXII' of FIG. 21, and FIG. 23 is a cross-sectional view taken along lines XXIIIa-XXIIIa' and XXIIIb-XXIIIb' of FIG. 21.

Referring to FIG. 19, the input sensing layer 40 may include the first sensing electrodes SP1, first trace lines 415-1, 415-2, 415-3, 415-4, and 415-5 connected to the first sensing electrodes SP1, the second sensing electrodes SP2, and second trace lines 425-1, 425-2, 425-3, and 425-4 connected to the second sensing electrodes SP2.

The first sensing electrodes SP1 may be arranged in the x-direction, and the second sensing electrodes SP2 may be arranged in the y-direction that intersects with the x-direction. First sensing electrodes SP1 arranged in the x-direction may be connected to each other through the first connection electrode CP1 between neighboring first sensing electrodes SP1 and may constitute first sensing lines R1, R2, R3, R4, and R5. Second sensing electrodes SP2 arranged in the y-direction may be connected to each other through the second connection electrode CP2 between neighboring second sensing electrodes SP2 and may constitute second sensing lines C1, C2, C3, and C4. The first sensing lines R1, R2, R3, R4, and R5 may intersect with the second sensing lines C1, C2, C3, and C4. For example, the first sensing lines R1, R2, R3, R4, and R5 may be perpendicular to the second sensing lines C1, C2, C3, and C4.

The first sensing lines R1, R2, R3, R4, and R5 and the second sensing lines C1, C2, C3, and C4 are arranged in the display area DA. The first sensing electrodes SP1, the first connection electrodes CP1, the second sensing electrodes SP2, and the second connection electrodes CP2 include a conductive material. Specific structures of the first sensing electrodes SP1, the first connection electrodes CP1, the second sensing electrodes SP2, and the second connection electrodes CP2 are the same as those described above with reference to one or more of FIGS. 9A to 11O.

The first sensing lines R1, R2, R3, R4, and R5 and the second sensing lines C1, C2, C3, and C4 may be respectively connected to terminals of a sensing signal pad 440 through the first trace lines 415-1, 415-2, 415-3, 415-4, and 415-5, and second trace lines 425-1, 425-2, 425-3, and 425-4 formed in the outer area PA. The first sensing lines R1, R2, R3, R4, and R5 may be respectively connected to the first trace lines 415-1, 415-2, 415-3, 415-4, and 415-5. The second sensing lines C1, C2, C3, and C4 may be respectively connected to the second trace lines 425-1, 425-2, 425-3, and 425-4.

FIG. 19 shows a double routing structure in which the second trace lines 425-1, 425-2, 425-3, and 425-4 are connected to an upper side and a lower side of the second sensing lines C1, C2, C3, and C4, respectively. Sensing sensitivity may be improved through the double routing structure. In an embodiment, the second trace lines 425-1, 425-2, 425-3, and 425-4 are connected to an upper side or a lower side of the second sensing lines C1, C2, C3, and C4. The arrangement of the first and second trace lines 415-1, 415-2, 415-3, 415-4, and 415-5, and 425-1, 425-2, 425-3, and 425-4 may be configured according to embodiments, depending on a shape and size of the display area DA, or a sensing method, etc. of the input sensing layer 40.

The cover layer 730 and a conductive sector group 800 may be located in the intermediate area MA.

Referring to FIG. 20, the sector group 800 may include a plurality of sectors, for example, first to seventh sectors 810, 820, 830, 840, 850, 860, and 870. Though FIG. 20 shows seven sectors, the number of sectors may be configured according to embodiments.

The plurality of sectors, for example, the first to seventh sectors 810, 820, 830, 840, 850, 860, and 870 may be arranged in a circumferential direction surrounding the first area OA in the intermediate area MA. The plurality of sectors, for example, the first to seventh sectors 810, 820, 830, 840, 850, 860, and 870 may be spaced from each other.

Areas of the first and second sensing electrodes SP1 and SP2 that are adjacent to the first area OA may be less than areas of the other first and second sensing electrodes SP1 and SP2. At least one of the sectors, for example, the first to seventh sectors 810, 820, 830, 840, 850, 860, and 870 may be electrically connected to the first or second sensing electrodes SP1 or SP2. A sensing sensitivity of the first or second sensing electrode SP1 or SP2 having a relatively small area around the first area OA may be compensated for the above-described connection structure, some first sensing electrodes SP1 around the first area OA may be electrically connected to each other through one or more of the sectors, and/or some second sensing electrodes SP2 around the first area OA may be electrically connected to each other through one or more of the sectors.

For example, second sensing electrodes SP2 respectively arranged at opposite sides (upper and lower sides) of the first area OA may be electrically connected through first and second sub-connection electrodes 421A and 421B. The first and second sub-connection electrodes 421A and 421B may be electrically connected to a sector located on a layer different from a layer on which the first and second sub-connection electrodes 421A and 421B are located. In an embodiment, as shown in FIG. 22, the first sub-connection electrode 421A may be located on the lower insulating layer 401, and the first sector 810 may be located on the intermediate insulating layer 403. The first sector 810 may be connected to first and second portions 421Aa and 421Ab of the first sub-connection electrode 421A through contact holes formed in the intermediate insulating layer 403. Likewise, the second sub-connection electrode 421B may be located on the lower insulating layer 401, the sixth sector 860 may be located on the intermediate insulating layer 403, and the sixth sector 860 may be connected to first and second portions 421Ba and 421Bb of the second sub-connection electrode 421B through contact holes formed in the intermediate insulating layer 403.

As shown in FIG. 20, neighboring first sensing electrodes SP1 respectively arranged on the upper right side and the upper left side of the first area OA may be electrically connected through the first connection electrode CP1. Neighboring first sensing electrodes SP1 respectively arranged on the lower right side and the lower left side of the first area OA may be electrically connected through third and fourth sub-connection electrodes 411A and 411B and the fifth sector 850. In an embodiment, the first sensing electrodes SP1, the third and fourth sub-connection electrodes 411A and 411B, and the fifth sector 850 may be located on the same layer and formed as one body. Alternatively, some of the first sensing electrodes SP1, the third and fourth sub-connection electrodes 411A and 411B, and the fifth sector 850 may be arranged on different layers and connected through at least a contact hole formed in an insulating layer.

At least one of the first to seventh sectors 810, 820, 830, 840, 850, 860, or 870 may be electrically connected to the first or second sensing electrodes SP1 or SP2. FIG. 20 shows that the first and sixth sectors 810 and 860 are connected to the second sensing electrode SP2, and shows that the second, third, and fifth sectors 820, 830, and 850 are connected to the first sensing electrode SP1. In an embodiment, like the first and sixth sectors 810 and 860 are connected to the first sensing electrode SP1, and the second, third, and fifth sectors 820, 830, and 850 are connected to the second sensing electrode SP2, the sectors may be electrically connected to the sensing electrodes that neighbor or do not neighbor each other. Some of the sectors, for example, the fourth and seventh sectors 840 and 870 may not be connected to any of the sensing electrodes.

The cover layer 730 may be closer to the first area OA than the sector group 800. As shown in FIG. 21, the first end 730E1 of the cover layer 730 may be spaced from the sectors by a predetermined interval. The cover layer 730 covers the first end 720E1 of the planarization layer 720.

The cover layer 730 may be located on a layer different from a layer on which the sector group 800 is arranged. For example, the first to seventh sectors 810, 820, 830, 840, 850, 860, and 870 may be located on the same layer on which the second conductive layer 420 of the input sensing layer 40 (see FIG. 12) is arranged, and the cover layer 730 may be located on the same layer on which the first conductive layer 410 of the input sensing layer 40 (see FIG. 12) is arranged. In an embodiment, as shown in FIG. 23, the cover layer 730 may be located on the second insulating layer 740 (which includes the same material as that of the second sub-lower insulating layer 401b), and the first sector 810 may be located on the intermediate insulating layer 403 (which includes the same material as that of the third insulating layer 750).

The cover layer 730 may include a metal layer. For example, the cover layer 730 may include a metal multilayer structure in which a titanium layer, an aluminum layer, and a titanium layer are sequentially stacked.

Unlike at least one sector of the sector group 800 is electrically connected to the first or second sensing electrode SP1 or SP2, the cover layer 730 may be in a floating state (i.e., not electrically connected to other conductors). For example, the cover layer 730 may include/be a floating electrode. In an embodiment, the cover layer 730 may have a predetermined voltage level (e.g. a constant voltage). For example, the cover layer 730 may be electrically connected to an electrode or a line located in the display area DA or the outer area PA.

Figure 24:
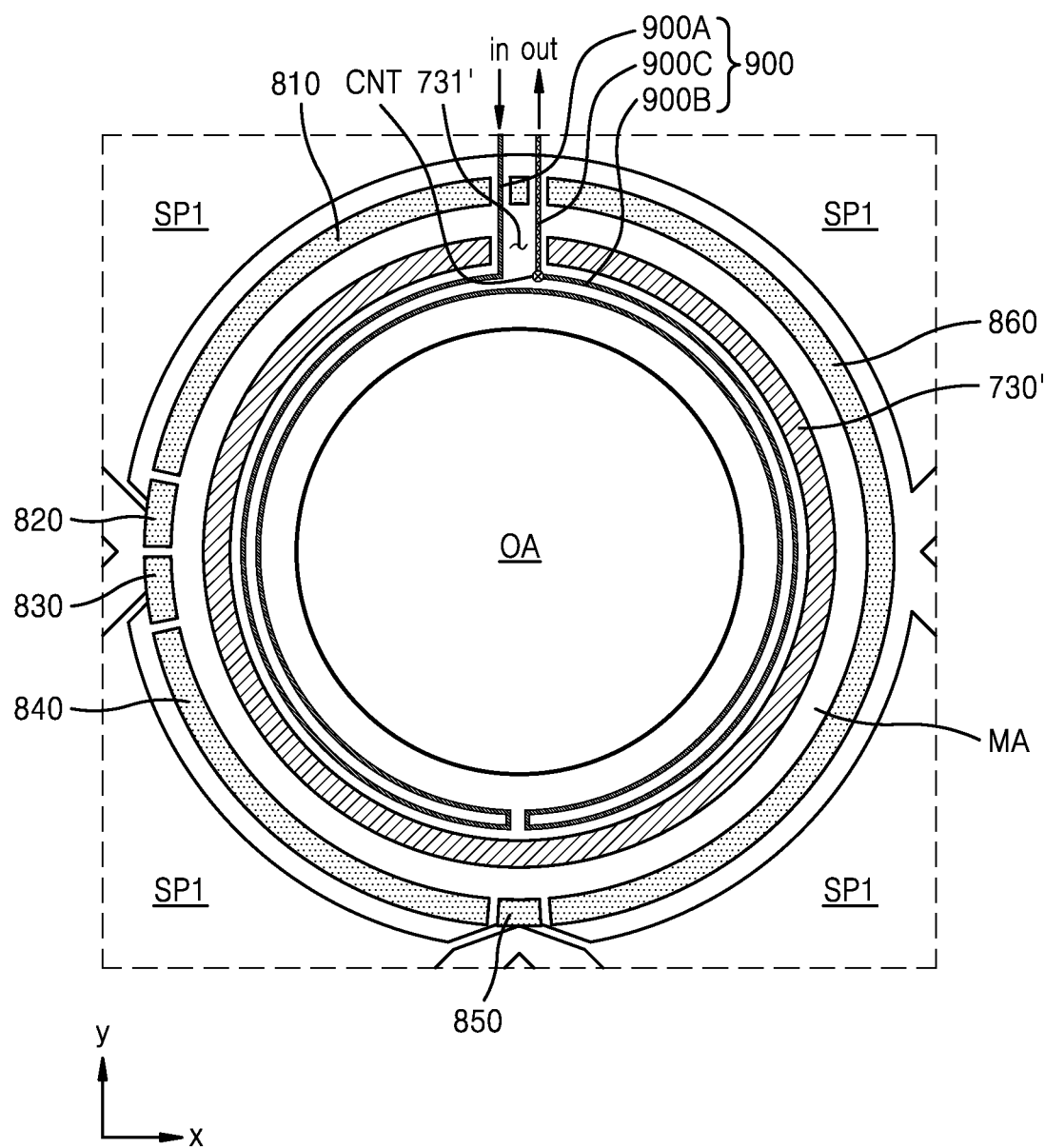
FIG. 24 is a plan view of a first area and a neighborhood of the first area of a display device according to an embodiment.
Figure 25:
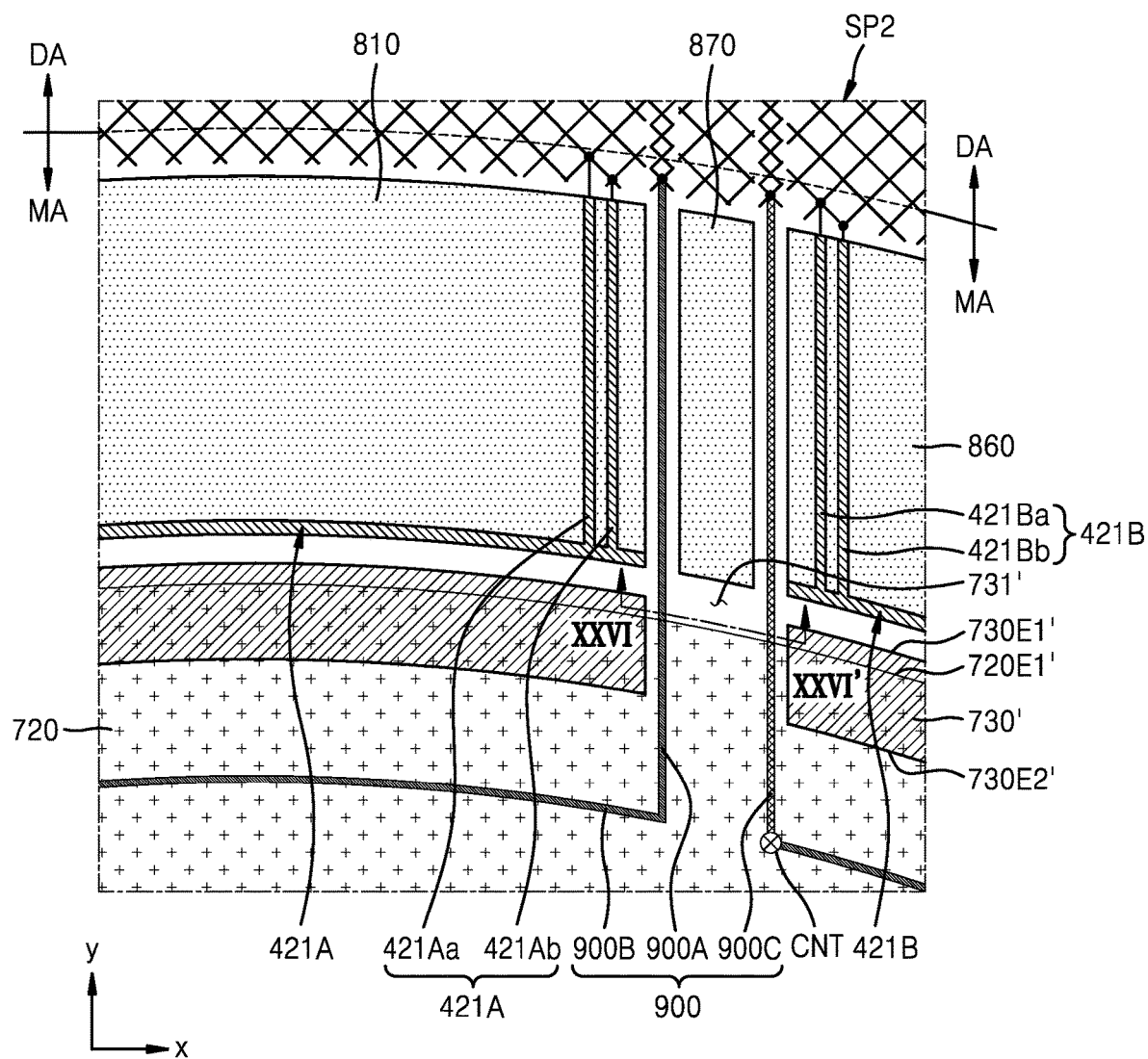
FIG. 25 is a plan view of a portion of FIG. 24 according to an embodiment.
Figure 26:
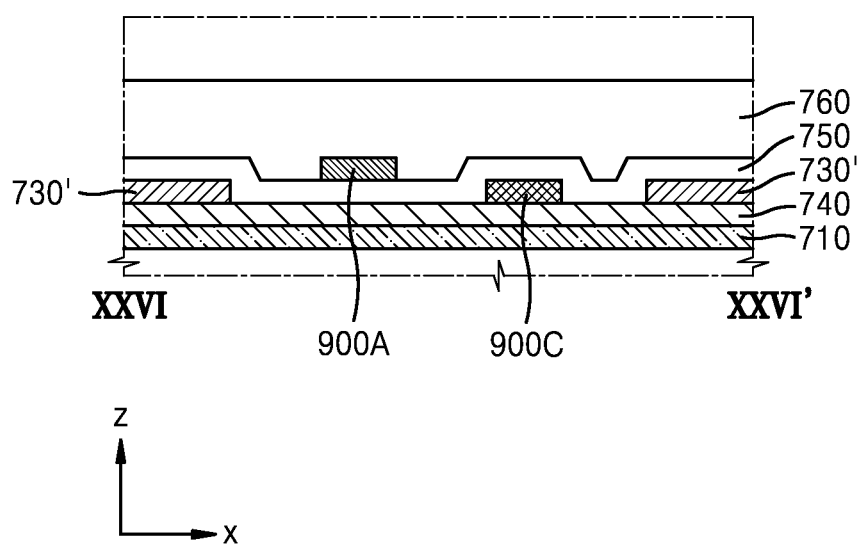
FIG. 26 is a cross-sectional view taken along line XXVI-XXVI' of FIG. 25 according to an embodiment.
Figure 27:
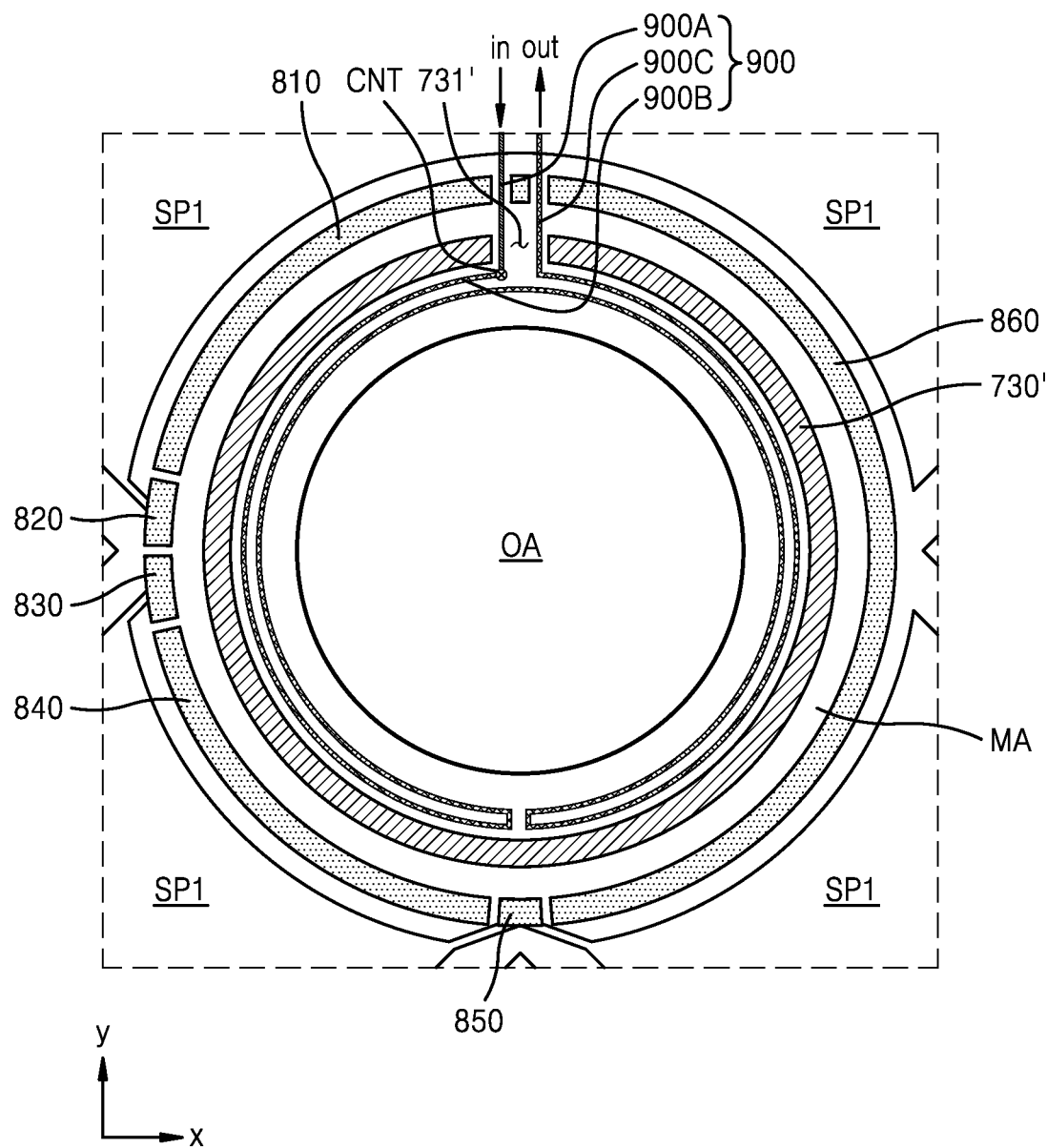
FIG. 27 is a plan view of a first area and a neighborhood of the first area of a display device according to an embodiment.

FIG. 24 is a plan view of the first area OA and a neighborhood of the first area OA of the display device 1 according to an embodiment, FIG. 25 is a plan view of a portion of FIG. 24, FIG. 26 is a cross-sectional view taken along line XXVI-XXVI' of FIG. 25, and FIG. 27 is a plan view of the first area OA and a neighborhood of the first area OA of the display device 1 according to an embodiment.

Referring to FIG. 24, other elements except a cover layer 730' and a wire 900 are analogous to or substantially the same as elements described above with reference to one or more FIGS. 20 to 23. Differences are mainly described.

The cover layer 730 described with reference to FIGS. 20 to 23 has a ring shape surrounding the first area OA. In contrast, the cover layer 730' shown in FIG. 24 may have a C-shape in which at least one side of the cover layer 730' is open. The cover layer 730' may partially surround the first area OA. In a plan view, two ends of the cover layer 730' may be spaced from each other at an open portion 731' by a predetermined interval. A portion of the first end 720E1 of the planarization layer 720 that corresponds to the open portion 731' is not covered by the cover layer 730', as shown in FIG. 25.

The wire 900 may be arranged in the intermediate area MA. The wire 900 includes a first portion 900A and a third portion 900C located in the open portion 731', and includes a second portion 900B connected between the first portion 900A and the third portion 900C. In an embodiment, the second portion 900B may be located on the same layer on which the first portion 900A is arranged and may be formed as one body with the first portion 900A. The second portion 900B may not be located on a layer on which the third portion 900C is arranged and may be electrically connected to the third portion 900C through a contact hole CNT (see FIG. 25).

In an embodiment, the first portion 900A and the second portion 900B of the wire 900 may be located on the same layer on which the sector group 800 (which includes the first sector 810) is arranged, and the third portion 900C may be located on the same layer on which the cover layer 730 is arranged. The first portion 900A and the second portion 900B of the wire 900 may be located on the same layer on which the second conductive layer of the input sensing layer 40 is arranged, and the third portion 900C of the wire 900 may be located on the same layer on which the first conductive layer of the input sensing layer 40 is arranged. For example, as shown in FIG. 26, the first portion 900A of the wire 900 may be located on the third insulating layer 750, and the third portion 900C of the wire 900 may be located on the second insulating layer 740. In an embodiment, the first portion 900A and the second portion 900B of the wire 900 may be located on the same layer (e.g. the second insulating layer 740) on which the first conductive layer of the input sensing layer 40 is arranged, and the third portion 900C may be located on the same layer (e.g. the third insulating layer 750) on which the second conductive layer of the input sensing layer 40 is arranged.

FIGS. 24 and 25 show that the second portion 900B of the wire 900 is formed as one body with the first portion 900A, and that the third portion 900C is located on a layer different from a layer on which the first and second portions 900A and 900B are arranged. In an embodiment, as shown in FIG. 27, the second portion 900B of the wire 900 may be located on a layer different from a layer on which the first portion 900A is arranged. The second portion 900B may be located on the same layer on which the third portion 900C is arranged and formed as one body with the third portion 900C. In an embodiment, the second portion 900B may be electrically connected to the first portion 900A through a contact hole CNT formed in an intervening insulating layer.

A signal applied through the first portion 900A of the wire 900 may pass through the second portion 900B and may be output through the third portion 900C. When a crack occurs around the first area OA and a portion of the wire 900 is disconnected, a signal may not be output through the third portion 900C. In this manner, the wire 900 may be used to examine whether a crack occurs around the first area OA.

Figure 28:
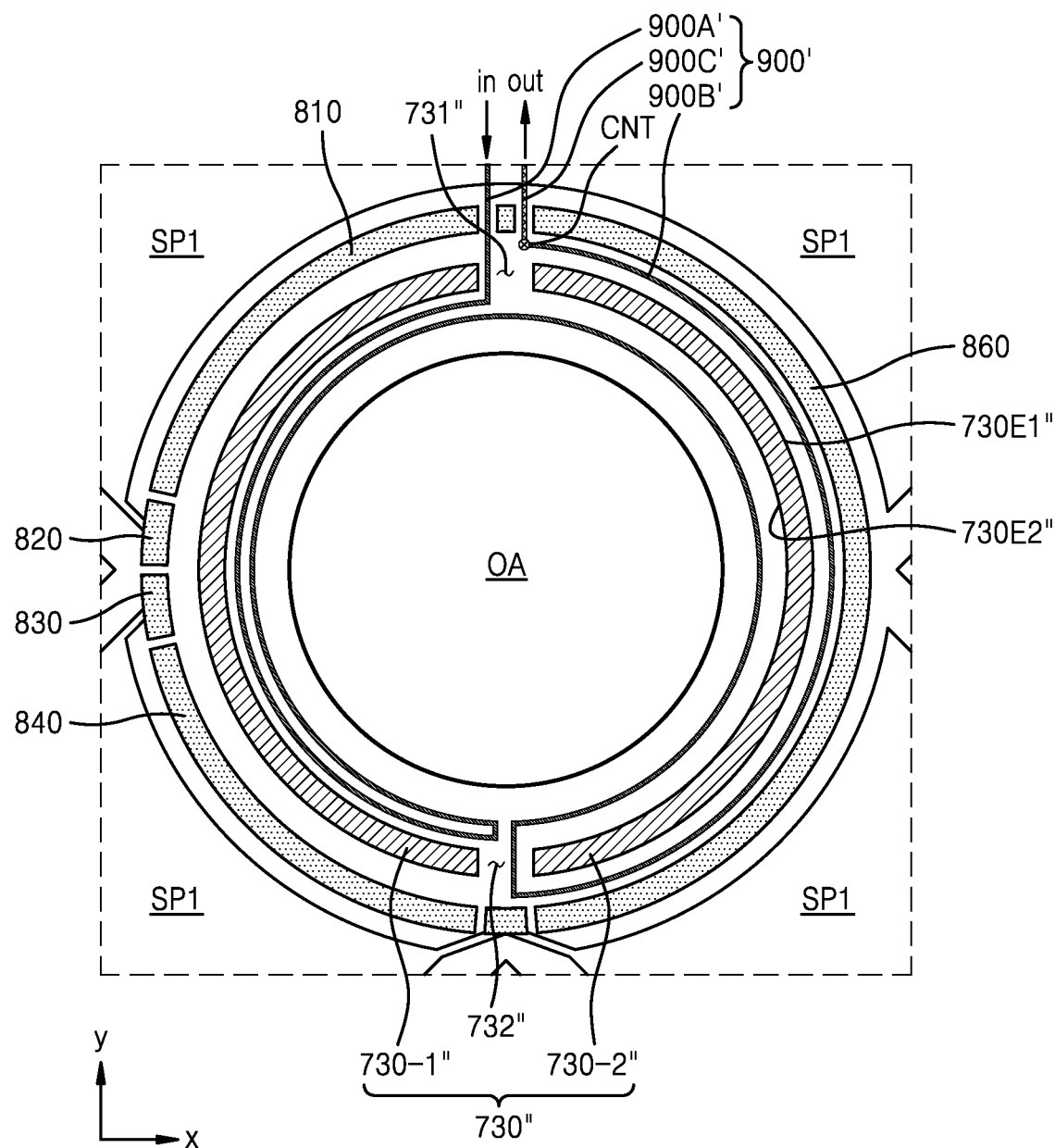
FIG. 28 is a plan view of an opening area and a neighborhood of the opening area of a display device according to an embodiment.

FIG. 28 is a plan view of an opening area and a neighborhood of the opening area of the display device 1 according to an embodiment.

A structure of a wire 900' and a structure of a cover layer 730" illustrated in the example of FIG. 28 are different from those described above with reference to FIGS. 24 to 27. The other elements except the wire 900' and the cover layer 730" are analogous to or substantially the same as elements described above with reference to one or more of FIGS. 20 to 23. Differences are mainly described.

A first portion 900A' of the wire 900' may be located in a first open portion 731" of the cover layer 730", and a third portion 900C' may not be located in the first open portion 731" of the cover layer 730". A second portion 900B' may connect the first portion 900A' and the third portion 900C', may extend along an inner edge of the cover layer 730", and may extend an outer edge of the cover layer 730". The outer edge of the cover layer 730" may denote a first end 730E1" of the cover layer 730", and the inner edge of the cover layer 730" (between the first area OA and the outer edge of the cover layer 730") may denote a second end 730E2" of the cover layer 730".

In an embodiment, the second open portion 732" may be provided at a location different from that in FIG. 26. In an embodiment, the number of second open portions 732" may be two or more, and thus the second portion 900B' of the wire 900' may repeatedly extend along the inner edge of the cover layer 730" and the outer edge of the cover layer 730". The cover layer 730" may include two segments 730-1" and 730-2" as shown in FIG. 26, or more than two segments depending the number of second open portions 732". The segments 730-1" and 730-2" may be substantially conform to a circumference of the first area OA.

Figure 29:
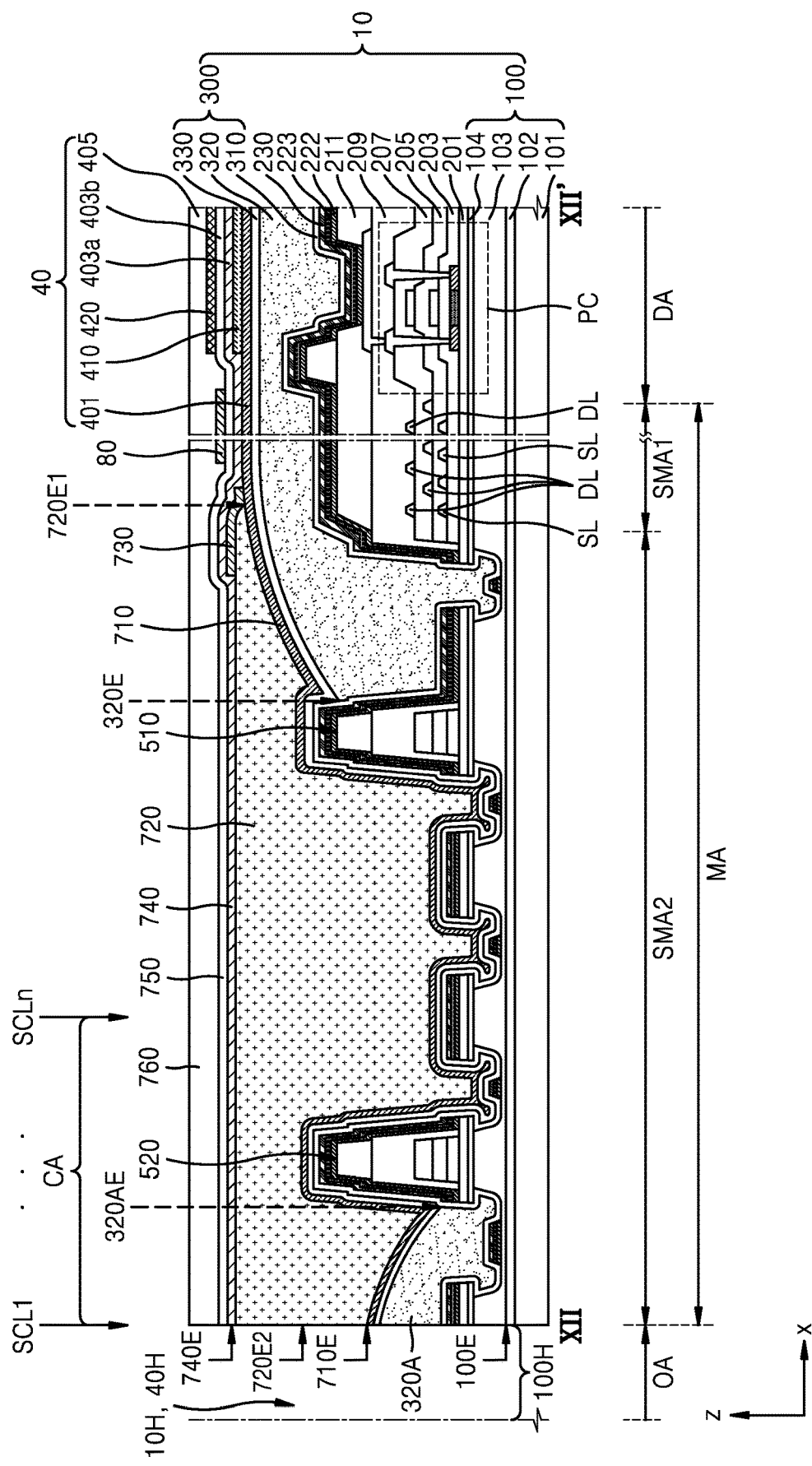
FIG. 29 is a cross-sectional view of a portion of a display device according to an embodiment.

FIG. 29 is a cross-sectional view of a portion of the display device 1 according to an embodiment.

Referring to FIG. 29, a location of the cover layer 730 is different from that described above with reference to FIG. 12. The cover layer 730 may be located directly on the planarization layer 720 shown in FIG. 29.

A first end of the cover layer 730 may extend toward the display area DA beyond the first end 720E1 of the planarization layer 720. A first portion of the cover layer 730 that extends toward the display area DA beyond the first end 720E1 of the planarization layer 720 may directly contact a top surface of the first insulating layer 710. A second end of the cover layer 730 may extend toward the first area OA on the planarization layer 720 and thus a second portion of the cover layer 730 including the second end 730E2 may directly contact a top surface of the planarization layer 720.

The cover layer 730 described with reference to FIG. 12 is arranged on the second insulating layer 740. In an embodiment, referring to FIG. 29, the cover layer 730 may be arranged under the second insulating layer 740. In an embodiment, the second insulating layer 740 may include the same material as that of a first sub-intermediate insulating layer 403a of an intermediate insulating layer included in the input sensing layer 40 and may be formed as one body with the first sub-intermediate insulating layer 403a. The third insulating layer 750 may include the same material as that of a second sub-intermediate insulating layer 403b of the intermediate insulating layer included in the input sensing layer 40 and may be formed as one body with the second sub-intermediate insulating layer 403b. The first insulating layer 710 may include the same material as that of the lower insulating layer 401 included in the input sensing layer 40 and may be formed as one body with the lower insulating layer 401. The fourth insulating layer 760 may include the same material as that of the upper insulating layer 405 included in the input sensing layer 40 and may be formed as one body with the upper insulating layer 405.

The cover layer 730 may be located on the same layer on which a conductive layer, for example, the first conductive layer included in the input sensing layer 40 is arranged and may include the same material as that of the first conductive layer. Characteristics of the embodiment described with reference to FIG. 29 are applicable to one or more of the embodiments described above with reference to one or more FIGS. 15 to 28 and/or related embodiments.

Figure 30:
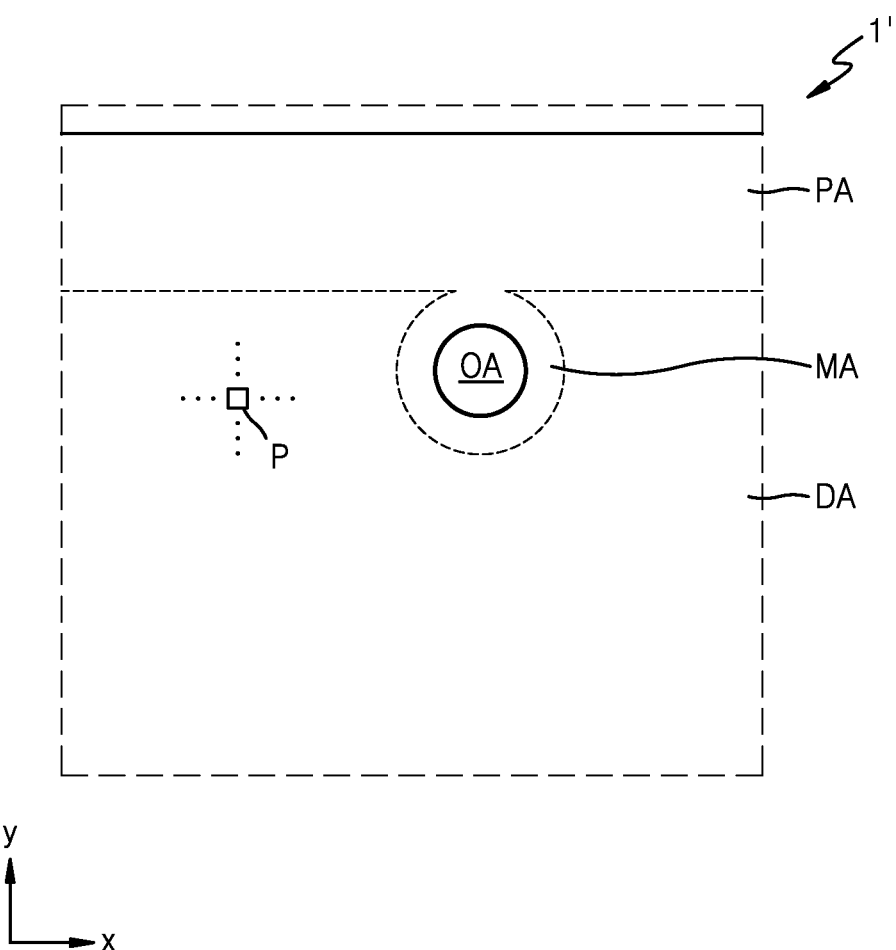
FIG. 30 is a plan view of a display device according to an embodiment.
Figure 31:
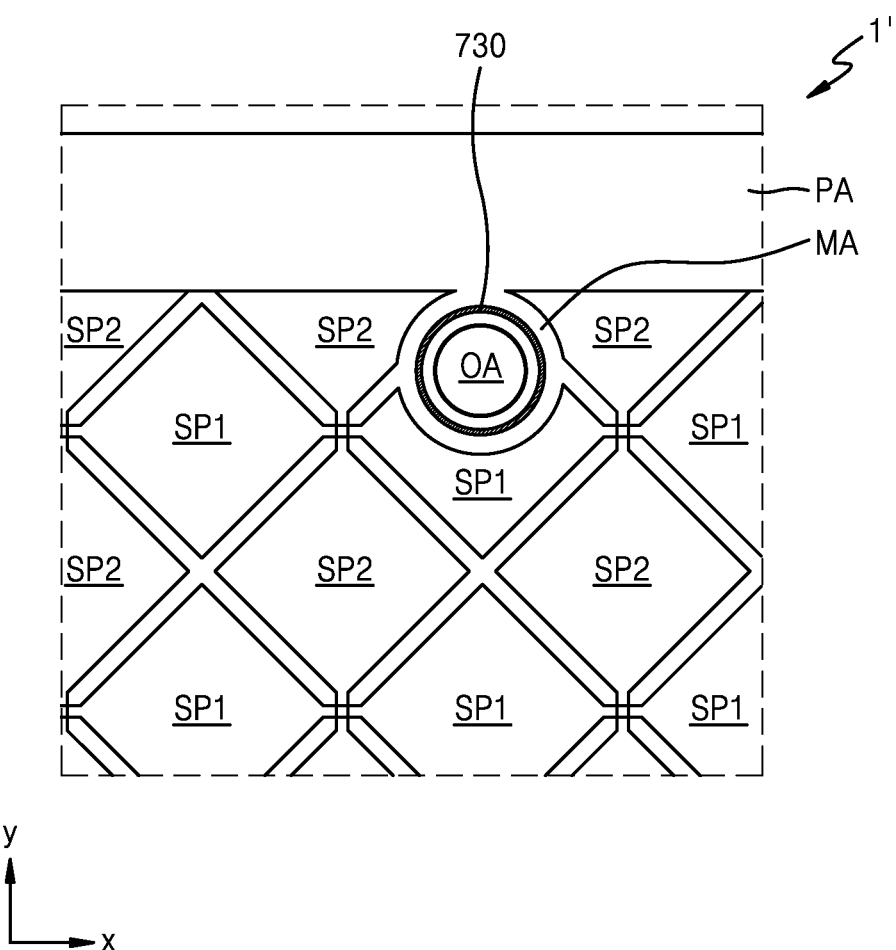
FIG. 31 is a plan view of a cover layer of a display device according to an embodiment.

FIG. 30 is a plan view of a portion of the display device 1' according to an embodiment, and FIG. 31 is a plan view of the cover layer 730 of the display device 1' according to an embodiment.

As shown in FIG. 30, in a display device 1', the first area OA may be partially surrounded by the display area DA. For example, a pixel may not be provided to an upper side of the first area OA in a plan view. The intermediate area MA between the first area OA and the display area DA, and the outer area PA may be connected to each other.

Referring to FIG. 31, the cover layer 730 may have a ring shape at least partially surrounding the first area OA. Configurations of the cover layer 730 and the neighborhood are analogous to or substantially the same as those described above with reference to one or more of FIGS. 12 to 23. The cover layer 730 may include at least one open portion as described with reference to one or more of FIGS. 24 to 28 in an embodiment.

Embodiment may prevent occurrence of defects such as floating or separation of a layer around the opening area.

Although example embodiments have been described with reference to the drawings, various changes in form and details and equivalents may be made without departing from the scope defined by the following claims.

What is claimed is:
1. A display device comprising:
   a substrate including a hole and a display area surrounding the hole;
   a display element located in the display area and including a pixel electrode, an opposite electrode, and an intermediate layer between the pixel electrode and the opposite electrode;

an encapsulation layer covering the display element, the encapsulation layer including at least one inorganic encapsulation layer and at least one organic encapsulation layer;
an input sensing layer located on the encapsulation layer, wherein the input sensing layer includes a plurality of touch electrodes;
a planarization layer located on the substrate, overlapping no display element of the display device in a direction perpendicular to the substrate, and located in an intermediate area between the hole and the display area, wherein a first edge of the planarization layer is located between the display element and a second edge of the planarization layer; and
a cover layer at least partially covering the first edge of the planarization layer and exposing the second edge of the planarization layer, wherein the cover layer and at least one of the touch electrodes are disposed directly on a same layer.

2. A display device comprising:
a substrate including a hole;
a display element located on the substrate and including a pixel electrode, an opposite electrode, and an intermediate layer between the pixel electrode and the opposite electrode;
an encapsulation layer covering the display element, the encapsulation layer including at least one inorganic encapsulation layer and at least one organic encapsulation layer;
an input sensing layer located on the encapsulation element, wherein the input sensing layer includes a plurality of touch electrodes;
a planarization layer located on the substrate and located between the hole and the display element, wherein a first edge of the planarization layer is located closer to the display element than a second edge of the planarization layer; and
a cover layer at least partially covering the first edge of the planarization layer, wherein the cover layer and at least one of the touch electrodes are disposed on a same layer, wherein the cover layer includes a same material as that of the at least one of the touch electrodes.

3. The display device of claim 2, wherein the cover layer includes a metal material.

4. The display device of claim 1, wherein the input sensing layer comprises:
a first conductive layer; and
a second conductive layer over the first conductive layer, wherein an intermediate insulating layer is between the first conductive layer and the second conductive layer, wherein:
at least one selected from the first conductive layer and the second conductive layer includes the plurality of touch electrodes, and
the cover layer includes a same material as that of the at least one selected from the first conductive layer and the second conductive layer.

5. The display device of claim 1, further comprising:
a first insulating layer between the planarization layer and the cover layer.

6. The display device of claim 5, further comprising:
a second insulating layer under the planarization layer, wherein the first insulating layer is in direct contact with the second insulating layer around the first edge of the planarization layer.

7. The display device of claim 6, wherein the encapsulation layer comprises:

a first inorganic encapsulation layer;
an organic encapsulation layer over the first inorganic encapsulation layer; and
a second inorganic encapsulation layer over the organic encapsulation layer,
wherein:
the second insulating layer is in direct contact with the second inorganic encapsulation layer, and
the direct-contact region between the second insulating layer and the second inorganic encapsulation layer is overlapped by the planarization layer.

8. The display device of claim 1, wherein:
a first part of the cover layer extends beyond the first edge of the planarization layer,
a second part of the cover layer overlaps the planarization layer, and
a first width from the first edge of the planarization layer to an edge of the first part of the cover layer is less than a second width from the first edge of the planarization layer to an edge of the second part of the cover layer.

9. The display device of claim 1, wherein:
a part of the planarization layer overlaps a part of the at least one organic encapsulation layer.

10. The display device of claim 1, further comprising:
a groove structure in the intermediate area and including an undercut cross-section, wherein at least one layer of the intermediate layer is separated by the groove structure; and
a partition wall in the intermediate area,
wherein the groove structure and the partition wall are overlapped by the planarization layer.

11. A display device comprising:
a substrate including a hole;
a display element disposed in a display area, the display area surrounding the hole of the substrate, the display element including a pixel electrode, an opposite electrode, and an intermediate layer between the pixel electrode and the opposite electrode;
an encapsulation layer covering the display element and including an organic encapsulation layer and at least one inorganic encapsulation layer;
an input sensing layer overlapping the display element, wherein the input sensing layer includes a plurality of touch electrodes;
a planarization layer disposed in an intermediate area between the hole and the display element and overlapping no display element of the display device in a direction perpendicular to the substrate, wherein the planarization layer surrounds the hole in a plan view and includes a first edge and a second edge, and wherein the first edge of the planarization layer is located between the display element and the second edge of the planarization layer; and
a cover layer at least partially covering the first edge of the planarization layer and exposing the second edge of the planarization layer.

12. The display device of claim 11, wherein the cover layer at least partially surrounds the hole in the substrate in a plan view.

13. The display device of claim 12, wherein the cover layer has a curved shape with an open portion in a plan view.

14. The display device of claim 11, wherein the cover layer includes a same material as that of at least one of the touch electrodes.

15. The display device of claim 11, wherein the cover layer and at least one of the touch electrodes are disposed directly on a same layer.

16. The display device of claim 11, further comprising:
a first insulating layer under the planarization layer; and
a second insulating layer over the planarization layer, wherein the second insulating layer is in direct contact with the first insulating layer around the first edge of the planarization layer.

17. The display device of claim 16, wherein the input sensing layer comprising:
a first conductive layer overlapping the second insulating layer; and
a second conductive layer overlapping the first conductive layer, wherein an intermediate insulating layer is between the first conductive layer and the second conductive layer,
wherein:
at least one selected from the first conductive layer and the second conductive layer includes the plurality of touch electrodes, and
the cover layer includes a same material as that of the at least one selected from the first conductive layer and the second conductive layer.

18. The display device of claim 16, wherein the encapsulation layer comprises:
a first inorganic encapsulation layer; and
a second inorganic encapsulation layer, wherein the organic encapsulation layer is disposed between the first inorganic encapsulation layer and the second inorganic encapsulation layer, and wherein the first insulating layer directly contacts the second inorganic encapsulation layer.

19. The display device of claim 11, wherein:
a part of the planarization layer overlaps a part of the organic encapsulation layer.

20. The display device of claim 19, wherein:
the cover layer overlaps the part of the planarization layer and the part of the organic encapsulation layer.

21. The display device of claim 11, further comprising:
a groove structure in the intermediate area and including an undercut cross-section, wherein at least one layer of the intermediate layer is separated by the groove structure; and
a partition wall in the intermediate area,
wherein the groove structure and the partition wall are overlapped by the planarization layer.

* * * * *